United States Patent
Furuhata

(10) Patent No.: US 9,321,627 B2
(45) Date of Patent: *Apr. 26, 2016

(54) ELECTRONIC DEVICE, ELECTRONIC MODULE, ELECTRONIC APPARATUS, AND MOVING OBJECT

(71) Applicant: Seiko Epson Corporation, Tokyo (JP)

(72) Inventor: Makoto Furuhata, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/660,058

(22) Filed: Mar. 17, 2015

(65) Prior Publication Data

US 2015/0266720 A1    Sep. 24, 2015

(30) Foreign Application Priority Data

Mar. 18, 2014  (JP) ................................. 2014-054493

(51) Int. Cl.
*B81B 7/00* (2006.01)
*B81B 7/02* (2006.01)

(52) U.S. Cl.
CPC .............. *B81B 7/0041* (2013.01); *B81B 7/007* (2013.01); *B81B 7/02* (2013.01); *B81B 2201/025* (2013.01); *B81B 2201/0235* (2013.01)

(58) Field of Classification Search
CPC ................................................. H01L 41/0825
USPC ........................................................ 257/415
See application file for complete search history.

(56) References Cited

U.S. PATENT DOCUMENTS

| | | | |
|---|---|---|---|
| 6,890,834 B2 | 5/2005 | Komobuchi et al. |
| 6,965,107 B2 | 11/2005 | Komobuchi et al. |
| 7,004,025 B2 | 2/2006 | Tamura |
| 7,159,459 B2 | 1/2007 | Gogoi |
| 8,250,920 B2 | 8/2012 | Yamanaka et al. |
| 8,283,738 B2 | 10/2012 | Fujii et al. |
| 8,438,718 B2 | 5/2013 | Aono et al. |
| 2002/0051258 A1 | 5/2002 | Tamura |
| 2003/0183921 A1 | 10/2003 | Komobuchi et al. |
| 2004/0173751 A1 | 9/2004 | Komobuchi et al. |

(Continued)

FOREIGN PATENT DOCUMENTS

| | | |
|---|---|---|
| EP | 2375219 A1 | 10/2011 |
| JP | 11-083886 A | 3/1999 |
| JP | 2002-005950 A | 1/2002 |
| JP | 2003-100919 A | 4/2003 |

(Continued)

*Primary Examiner* — Marc Armand
(74) *Attorney, Agent, or Firm* — Harness, Dickey & Pierce, P.L.C.

(57) ABSTRACT

An electronic device includes an accommodation space formed between a first base material and a second base material, and a first functional element and a second functional element in the accommodation space. The accommodation space is disposed in an internal region of a bonding portion that bonds the first base material and the second base material together. The bonding portion includes a first bonding region provided on one side thereof and a second bonding region provided on the other side thereof. The electronic device includes a first wiring portion which is electrically connected to the first functional element and has a first direction toward the outside of the accommodation space through the first bonding region, and a second wiring portion which is electrically connected to the second functional element and has a second direction toward the outside of the accommodation space through the second bonding region.

19 Claims, 11 Drawing Sheets

(56) References Cited

U.S. PATENT DOCUMENTS

| | | |
|---|---|---|
| 2009/0183568 A1 | 7/2009 | Yamanaka et al. |
| 2010/0176466 A1 | 7/2010 | Fujii et al. |
| 2011/0209815 A1 | 9/2011 | Aono et al. |
| 2012/0111615 A1 | 5/2012 | Yoda et al. |
| 2013/0285172 A1 | 10/2013 | Jeong et al. |
| 2013/0312517 A1 | 11/2013 | Jeong et al. |
| 2015/0268266 A1* | 9/2015 | Furuhata ............ G01P 15/0888 |

FOREIGN PATENT DOCUMENTS

| | | |
|---|---|---|
| JP | 2009-168777 A | 7/2009 |
| JP | 2011-179821 A | 9/2011 |
| JP | 2012-088319 A | 5/2012 |
| JP | 2012-098208 A | 5/2012 |
| JP | 2012-122746 A | 6/2012 |
| JP | 2012-168097 A | 9/2012 |
| WO | WO-2010-119573 A1 | 10/2010 |

* cited by examiner

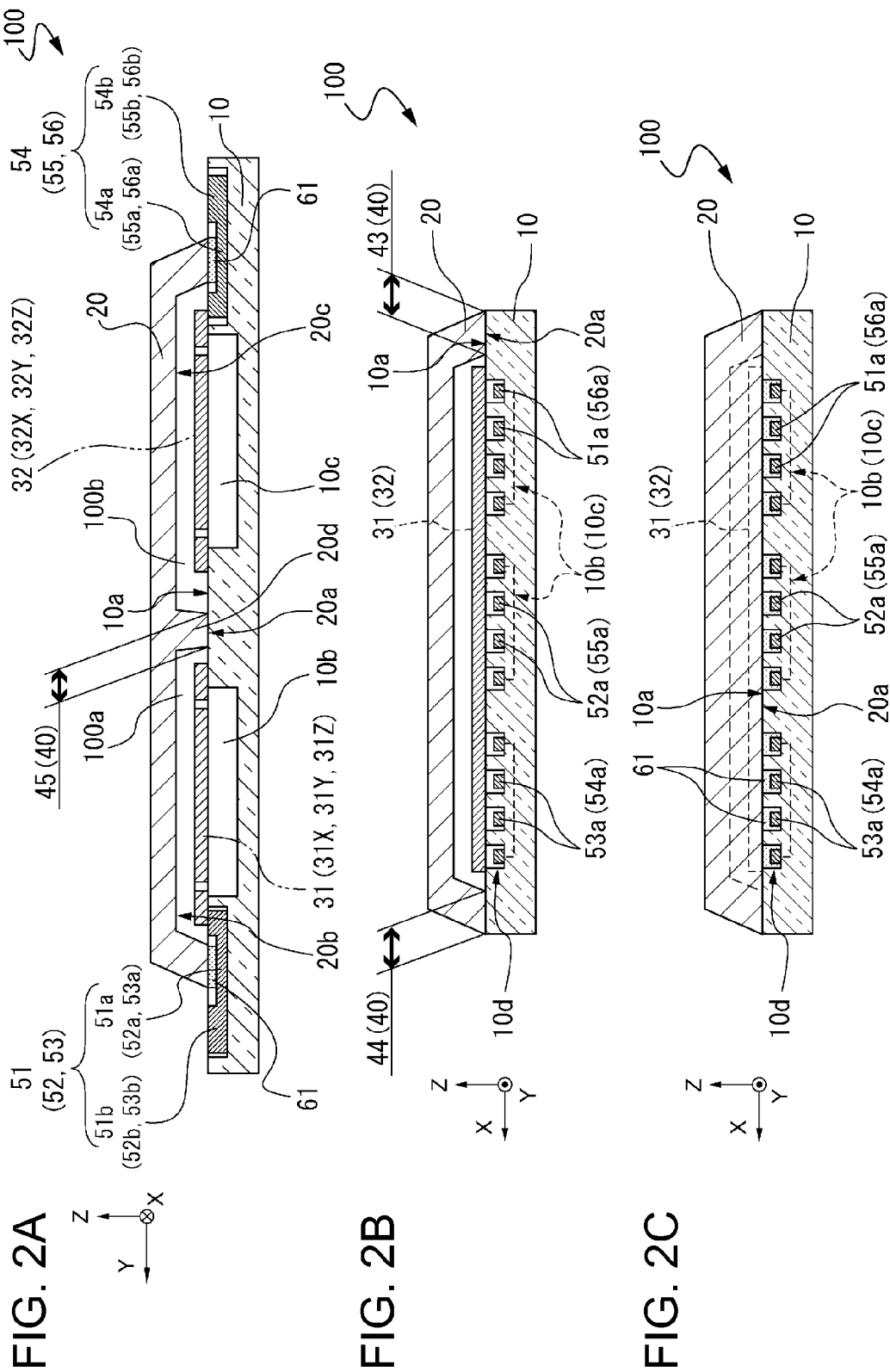

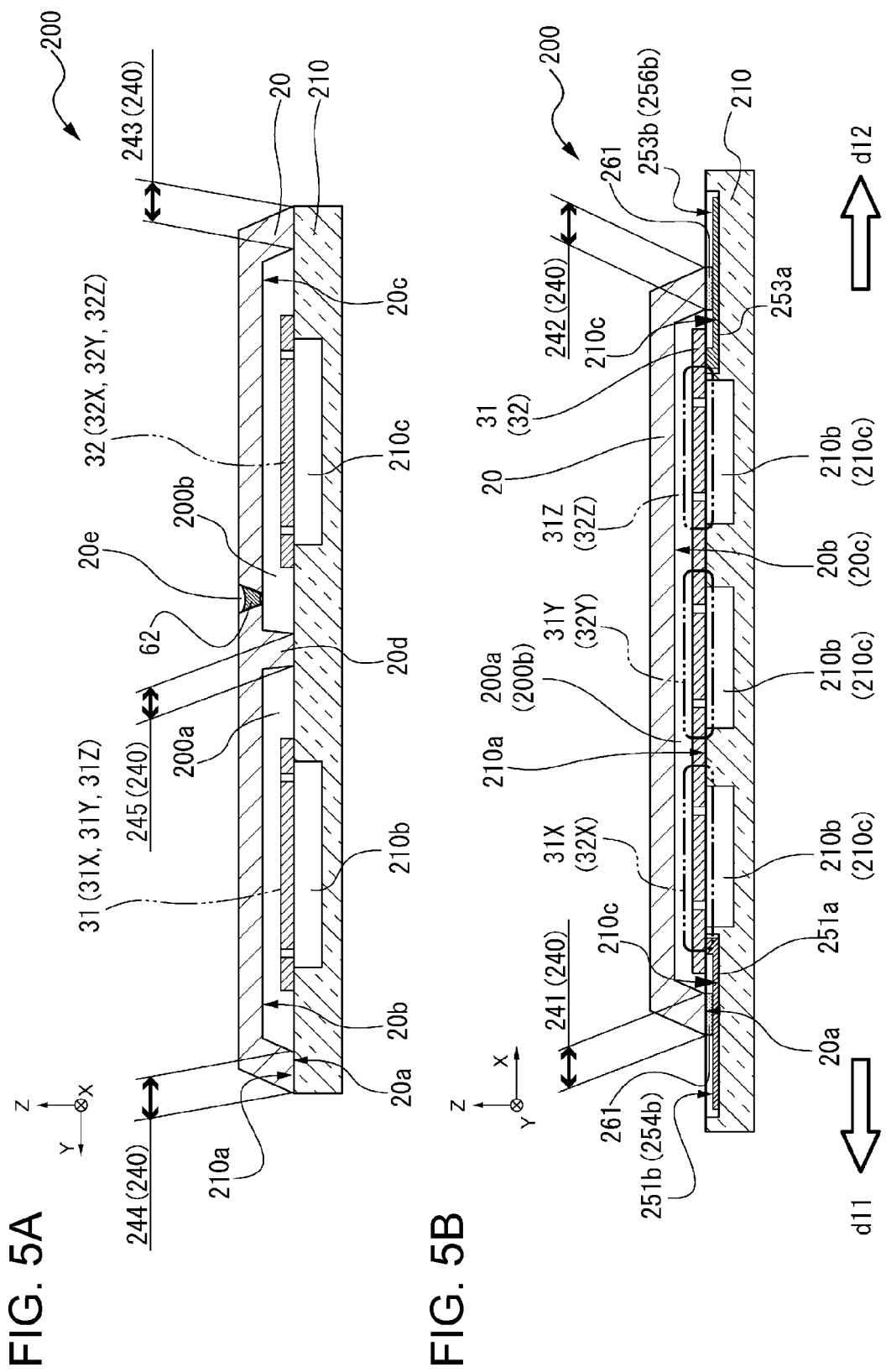

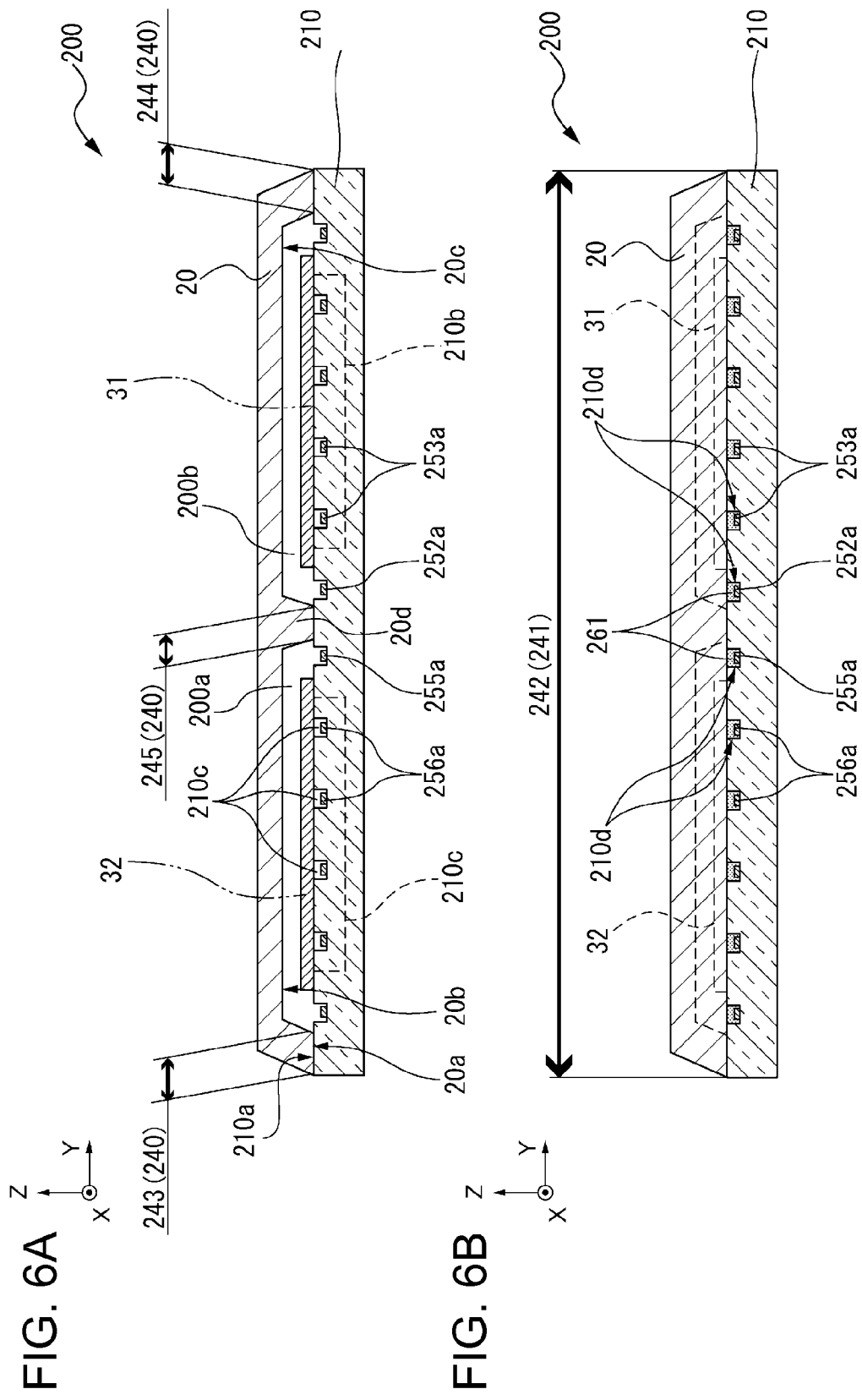

ELECTRONIC DEVICE, ELECTRONIC MODULE, ELECTRONIC APPARATUS, AND MOVING OBJECT

CROSS-REFERENCE TO RELATED APPLICATIONS

This application claims priority to Japanese Patent Application No. 2014-054493 filed on Mar. 18, 2014. The entire disclosure of Japanese Patent Application No. 2014-054493 is hereby incorporated herein by reference.

BACKGROUND

1. Technical Field

The present invention relates to an electronic device, an electronic module, an electronic apparatus, and a moving object.

2. Related Art

In recent years, electronic devices including a functional element, detecting a physical quantity, which is formed by a microelectromechanical systems (MEMS) technique using a semiconductor manufacturing method which is one of precise machining techniques have been developed as small-sized sensor devices. As the functional element, there has been known, for example, a physical quantity sensor element including a fixed electrode which is fixedly disposed and a movable electrode which is opposite to the fixed electrode at a predetermined interval and is provided so as to be displaceable and detecting a physical quantity such as acceleration or an angular velocity on the basis of capacitance between the fixed electrode and the movable electrode.

A composite sensor element formed by combining an acceleration sensor and an angular velocity sensor has been proposed as a composite sensor element formed by combining the physical quantity sensors and is disclosed as a motion detection sensor (JP-A-2002-005950).

In a method of manufacturing a functional element using a MEMS technique, the functional element is firmly fixed onto an insulating substrate such as, for example, glass, and micromachining is performed thereon. A conductive wiring for the input of a driving signal for driving the functional element or for the output of a detected signal based on a physical quantity detected is connected to the formed functional element, and it is disclosed that the conductive wiring is disposed so as to be drawn into a groove portion formed on one side of the insulating substrate (JP-A-2012-098208).

As disclosed in JP-A-2002-005950 and JP-A-2012-098208, the functional element is disposed in an accommodation space formed between a substrate and a lid member bonded to the substrate, and the inside of the accommodation space is maintained airtight. However, as disclosed in JP-A-2012-098208, a configuration is adopted in which the conductive wiring is disposed at the groove formed in the substrate, and the wiring is drawn to an electrode serving as a portion electrically connected to the outside. Thus, a portion (gap) where the accommodation space communicates with the outside is generated in a bonding portion between the substrate and the lid member (see FIG. 6 of JP-A-2012-098208) and is filled with an adhesive or the like to maintain airtightness.

However, as disclosed in JP-A-2012-098208, a plurality of wirings where the accommodation space communicates with the outside are provided in the bonding portion between the substrate and the lid member on only one side of the substrate when seen in a plan view. In addition, there is a tendency for a bonding state at a location at which the substrate and the lid member are bonded to each other to be different from a bonding state at a location at which a wiring is provided between the substrate and the lid member. Accordingly, the bonding state between the substrate and the lid member becomes unstable, and thus there is a concern of airtightness being deteriorated.

In addition, a sensor device is combined with a semiconductor element, that is, an IC which includes a circuit unit that drives a composite sensor and computes a detected signal to thereby constitute an electronic module. In this case, a conductive wire is generally used for the electrical connection between the composite sensor device and the IC. However, in the composite sensor device disclosed in JP-A-2002-005950, for example, when an IC connected to the angular velocity sensor and an IC connected to the acceleration sensor are combined with each other, there is a concern of the length of a conductive wire being increased. For this reason, the wiring resistance of the conductive wire or parasitic capacitance may be increased, which leads to the deterioration of performance of an electronic device including the composite sensor device.

SUMMARY

An advantage of some aspects of the invention is to provide an electronic device capable of forming a short electrical connection portion such as a conductive wire connected to a semiconductor element and reducing the deterioration of performance of the electronic device while maintaining a high degree of airtightness in a functional element accommodation space of the electronic device.

The invention can be implemented as the following forms or application examples.

Application Example 1

This application example is directed to an electronic device including a first base material; a second base material, having an accommodation space formed between the first base material and the second base material, which is bonded to the first base material through a bonding portion; and a first functional element and a second functional element which are accommodated in the accommodation space. The bonding portion includes a first bonding region and a second bonding region. The first base material or the second base material is provided with a first wiring portion and a second wiring portion. The first wiring portion is electrically connected to the first functional element and has a first direction toward the outside of the accommodation space through the first bonding region, and the second wiring portion is electrically connected to the second functional element and has a second direction toward the outside of the accommodation space through the second bonding region.

According to the electronic device of this application example, wirings are distributed to the first wiring portion and the second wiring portion, the first wiring portion being connected to the first functional element, extending to the first base material, and extending to the outside of the accommodation space through the first bonding region, and the second wiring portion being connected to the second functional element and extending to the outside of the accommodation space through the second bonding region. Thereby, it is possible to reduce a decrease in bonding strength between the first base material and the second base material in the first and second bonding regions.

Application Example 2

This application example is directed to the application example described above, wherein the first base material or the second base material includes a partition wall portion, and the accommodation space is divided into a first accommodation space and a second accommodation space by the partition wall portion. An extension direction of the partition wall portion is disposed along an extension direction of at least one of the first bonding region and the second bonding region. The first accommodation space accommodates the first functional element, and the second accommodation space accommodates the second functional element. The first accommodation space and the second accommodation space have different internal environments.

According to this application example, it is possible to obtain the electronic device having functional elements with different functions combined with each other. However, the number of wirings extending from the accommodation space through the first and second bonding regions to the outside is increased by combining the functional elements. Even when the number of wirings is increased, the wirings can be disposed so as to be distributed to the first bonding region and the second bonding region. Thus, it is possible to dispose a well-balanced bonding strength in the bonding region between the first base material and the second base material.

Application Example 3

This application example is directed to the application example described above, wherein the first accommodation space accommodates an angular velocity sensor element as the first functional element, and the second accommodation space accommodates an acceleration sensor element as the second functional element. The internal environment of the first accommodation space has a decompressed atmosphere, and the internal environment of the second accommodation space has a barometric atmosphere.

According to this application example, it is possible to configure an angular velocity sensor element and an acceleration sensor element, which are mounted to an apparatus such as, for example, a posture control system or a positioning system, as one device. In addition, the number of wirings extending from the accommodation space through the first and second bonding regions to the outside is increased by combining the angular velocity sensor element and the acceleration sensor element with each other. However, even when the number of wirings is increased, the wirings can be disposed so as to be distributed to the first bonding region and the second bonding region. Thus, it is possible to dispose a well-balanced bonding strength in the bonding region between the first base material and the second base material.

Application Example 4

This application example is directed to the application example described above, wherein at least one of the angular velocity sensor element and the acceleration sensor element includes at least detection axes in two directions intersecting each other.

According to this application example, the angular velocity sensor and the acceleration sensor are provided with a plurality of detection axes, and thus the number of wirings extending to the outside is increased. However, even when the number of wirings is increased, the wirings can be disposed so as to be distributed to the first bonding region and the second bonding region. Thus, it is possible to dispose a well-balanced bonding strength in the bonding region between the first base material and the second base material.

Application Example 5

This application example is directed to an electronic module including a first base material; a second base material, having an accommodation space formed between the first base material and the second base material, which is bonded to the first base material through a bonding portion; and a first functional element and a second functional element which are accommodated in the accommodation space. The bonding portion includes a first bonding region and a second bonding region. The electronic module further includes an electronic device having a first wiring portion and a second wiring portion which are provided in the first base material or the second base material, the first wiring portion being electrically connected to the first functional element and having a first direction toward the outside of the accommodation space through the first bonding region and the second wiring portion being electrically connected to the second functional element and having a second direction toward the outside of the accommodation space through the second bonding region, and a circuit element which is disposed so as to overlap at least a portion of the electronic device when seen in a plan view. The circuit element includes a first terminal portion electrically connected to the first wiring portion and a second terminal portion electrically connected to the second wiring portion. The first terminal portion is disposed on the first bonding region side of the electronic device, and the second terminal portion is disposed on the second bonding region side of the electronic device.

According to the electronic module of this application example, in the wiring portion included in the electronic device and the terminal portion included in the circuit element, the first wiring portion and the first terminal portion are disposed on the first bonding region side, that is, the first direction side, and the second wiring portion and the second terminal portion are disposed on the second bonding region side, that is, the second direction side. Accordingly, it is possible to dispose short connection members such as, for example, bonding wires which connect the wiring portions and the terminal portions. Thereby, it is possible to suppress the resistance of the connection members or parasitic capacitance therein and to obtain the electronic module having high accuracy.

Application Example 6

This application example is directed to the application example described above, wherein the first base material or the second base material includes a partition wall portion, and the accommodation space is divided into a first accommodation space and a second accommodation space by the partition wall portion. The extension direction of the partition wall portion is disposed along an extension direction of at least one of the first bonding region and the second bonding region. The first accommodation space accommodates the first functional element, and the second accommodation space accommodates the second functional element. The first accommodation space and the second accommodation space have different internal environments.

According to this application example, it is possible to obtain the electronic device having functional elements with different functions combined with each other. However, the number of wirings extending from the accommodation space through the first and second bonding regions to the outside is increased by combining the functional elements. Even when the number of wirings is increased, the wirings can be disposed so as to be distributed to the first bonding region and the second bonding region. Thus, it is possible to dispose a well-balanced bonding strength in the bonding region between the first base material and the second base material. Further, in the wiring portion included in the electronic device and the terminal portion included in the circuit element, the first wiring portion and the first terminal portion are disposed on the first bonding region side, that is, the first direction side, and the second wiring portion and the second terminal portion are disposed on the second bonding region side, that is, the second direction side. Accordingly, it is possible to dispose short connection members such as, for example, bonding wires which connect the wiring portions and the terminal portions. Thereby, it is possible to suppress the resistance of the connection members or parasitic capacitance and to obtain the electronic module including a composite functional element having high accuracy.

Application Example 7

This application example is directed to the application example described above, wherein the first accommodation space accommodates an angular velocity sensor element as the first functional element. The second accommodation space accommodates an acceleration sensor element as the second functional element. The internal environment of the first accommodation space has a decompressed atmosphere, and the internal environment of the second accommodation space has a barometric atmosphere.

According to this application example, it is possible to configure an angular velocity sensor element and an acceleration sensor element, which are mounted to an apparatus such as a posture control system or a positioning system, as one device. In addition, the number of wirings extending from the accommodation space through the first and second bonding regions to the outside is increased by combining the angular velocity sensor element and the acceleration sensor element. However, even when the number of wirings is increased, the wirings can be disposed so as to be distributed to the first bonding region and the second bonding region. Thus, it is possible to dispose a well-balanced bonding strength in the bonding region between the first base material and the second base material.

Application Example 8

This application example is directed to the application example described above, wherein at least one of the angular velocity sensor element and the acceleration sensor element includes at least detection axes in two directions intersecting each other.

According to this application example, the angular velocity sensor and the acceleration sensor are provided with a plurality of detection axes, and thus the number of wirings extending to the outside is increased. However, even when the number of wirings is increased, the wirings can be disposed so as to be distributed to the first bonding region and the second bonding region. Thus, it is possible to dispose a well-balanced bonding strength in the bonding region between the first base material and the second base material. In addition, it is possible to dispose short connection members such as, for example, bonding wires which connect the wiring portions and the terminal portions. Thereby, it is possible to suppress the resistance of the connection members or parasitic capacitance and to obtain the electronic module including a composite functional element having high accuracy.

Application Example 9

This application example is directed to the application example described above, wherein the first wiring portion and the first terminal portion are electrically connected to each other through a wire, and the second wiring portion and the second terminal portion are electrically connected to each other through a wire.

According to this application example, it is possible to easily configure the electronic device by connecting the wiring portions and the terminal portions through a wire, that is, a so-called bonding wire and to connect the wiring portions and the terminal portions through short bonding wires. Thus, it is possible to suppress the resistance of the bonding wires or parasitic capacitance and to obtain the electronic module including a composite functional element having high accuracy.

Application Example 10

This application example is directed to an electronic apparatus including the electronic device according to any one of the application examples described above.

According to the electronic apparatus of this application example, wirings are distributed to the first wiring portion and the second wiring portion, the first wiring portion being connected to the first functional element, extending to the first base material, and extending to the outside of the accommodation space through the first bonding region, and the second wiring portion being connected to the second functional element and extending to the outside of the accommodation space through the second bonding region. Thus, a decrease in bonding strength between the first base material and the second base material in the first and second bonding regions is suppressed. Thereby, it is possible to maintain a high degree of airtightness in the accommodation space and to obtain the electronic apparatus having high accuracy.

Application Example 11

This application example is directed to an electronic apparatus including the electronic module according to any one of the application examples described above.

According to the electronic apparatus of this application example, it is possible to dispose short connection members such as, for example, bonding wires which connect the wiring portions and the terminal portions. Thereby, it is possible to suppress the resistance of the connection members or parasitic capacitance and to obtain the electronic apparatus having high accuracy.

Application Example 12

This application example is directed to a moving object including the electronic device according to any one of the application examples described above.

According to the moving object of this application example, wirings are distributed to the first wiring portion and the second wiring portion, the first wiring portion being connected to the first functional element, extending to the first base material, and extending to the outside of the accommodation space through the first bonding region, and the second wiring portion being connected to the second functional element and extending to the outside of the accommodation space through the second bonding region. Thus, a decrease in bonding strength between the first base material and the second base material in the first and second bonding regions is suppressed. Thereby, it is possible to maintain a high degree of airtightness in the accommodation space and to obtain the moving object controlled with high accuracy.

Application Example 13

This application example is directed to a moving object including the electronic module according to any one of the application examples described above.

According to the moving object of this application example, it is possible to dispose short connection members such as, for example, bonding wires which connect the wiring portions and the terminal portions. Thereby, it is possible to suppress the resistance of the connection members or parasitic capacitance and to obtain the moving object controlled with high accuracy.

BRIEF DESCRIPTION OF THE DRAWINGS

The invention will be described with reference to the accompanying drawings, wherein like numbers reference like elements.

FIG. 1A is a plan view in a state where a second base material is omitted, and FIG. 1B is a cross-sectional view of a portion A-A' shown in FIG. 1A.

FIGS. 2A to 2C show the electronic device according to the first embodiment; FIG. 2A is an enlarged cross-sectional view of a portion B-B' shown in FIG. 1A, FIG. 2B is an enlarged cross-sectional view of a portion C-C' shown in FIG. 1A, and FIG. 2C is an enlarged cross-sectional view of a portion D-D' shown in FIG. 1A.

FIG. 3A is a plan view in a state where a second base material is omitted, and FIG. 3B is a cross-sectional view of a portion E-E' shown in FIG. 3A.

FIGS. 5A and 5B show the electronic device according to the second embodiment; FIG. 5A is a cross-sectional view of a portion F-F' shown in FIG. 4, and FIG. 5B is a cross-sectional view of a portion G-G' and a portion H-H' shown in FIG. 4.

FIGS. 6A and 6B show the electronic device according to the second embodiment; FIG. 6A is a cross-sectional view of a portion J-J' shown in FIG. 4, and FIG. 6B is a cross-sectional view of a portion K-K' shown in FIG. 4.

FIG. 7A is a plan view in which a mold member is omitted, and FIG. 7B is a cross-sectional view of a portion L-L' shown in FIG. 7A.

FIG. 8A is a plan view in which a mold member is omitted, and FIG. 8B is a cross-sectional view of a portion M-M' shown in FIG. 8A.

DESCRIPTION OF EXEMPLARY EMBODIMENTS

Hereinafter, embodiments according to the invention will be described with reference to the accompanying drawings.

First Embodiment

Figures 1A, 1B:
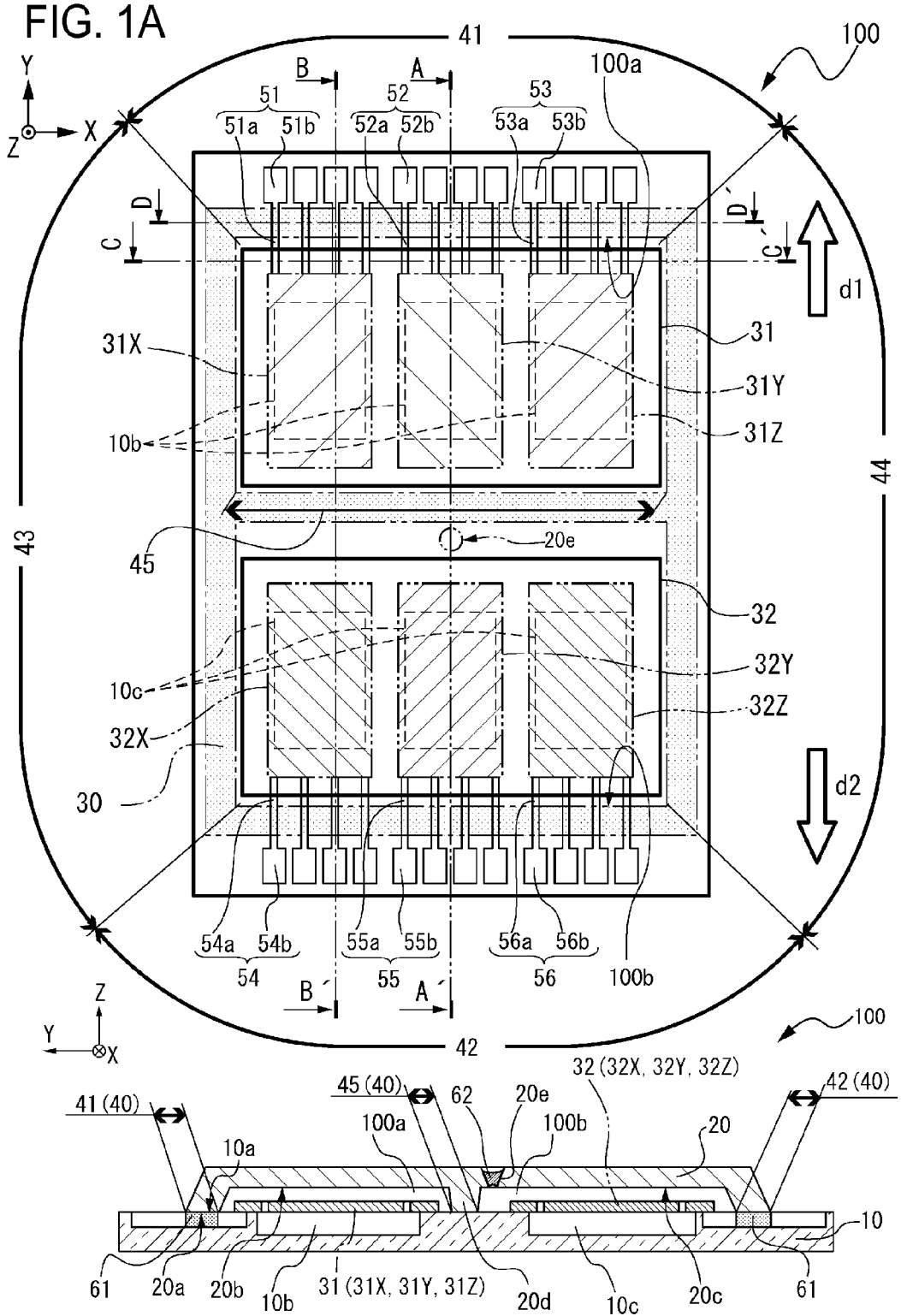
FIGS. 1A and 1B show an electronic device according to a first embodiment.

FIGS. 1A and 1B show an electronic device according to a first embodiment. FIG. 1A is a plan view in a state where a second base material is omitted, and FIG. 1B is a cross-sectional view of a portion A-A' shown in FIG. 1A.

As shown in FIG. 1B, a sensor device 100 as an electronic device according to the first embodiment includes a first base material 10, a second base material 20, an angular velocity sensor element 31 as a first functional element, and an acceleration sensor element 32 as a second functional element. The second base material 20 includes a first concave portion 20b formed on the side of a principal surface 20a which is one surface of the second base material 20, a second concave portion 20c, and a partition wall portion 20d which is formed by the first concave portion 20b and the second concave portion 20c. A principal surface 10a which is one surface of the first base material 10 is bonded to the principal surface 20a of the second base material 20.

The first base material 10 and the second base material 20 are bonded together, and a first accommodation space 100a is formed by the principal surface 10a of the first base material 10 and the first concave portion 20b of the second base material 20. An angular velocity sensor element 31 is accommodated in the first accommodation space 100a and is firmly fixed to the principal surface 10a of the first base material 10. Similarly, a second accommodation space 100b is constituted by the principal surface 10a of the first base material 10 and the second concave portion 20c of the second base material 20. An acceleration sensor element 32 is accommodated in the second accommodation space 100b and is firmly fixed to the principal surface 10a of the first base material 10. In other words, when the first base material 10 and the second base material 20 are superimposed on (bonded to) each other, a space formed by the principal surface 10a of the first base material 10 and the first concave portion 20b of the second base material 20 is assumed to be the accommodation space 100a, and a space formed by the principal surface 10a and the second concave portion 20c of the second base material 20 is assumed to be the second accommodation space 100b. In other words, the first accommodation space 100a and the second accommodation space 100b are formed between the first base material 10 and the second base material 20, and the second base material 20 is bonded to the first base material 10. Meanwhile, the accommodation spaces are spaces formed in association with the bonding between the first base material 10 and the second base material 20 and will be described by being denoted by reference numerals for convenience of description. Alternatively, the accommodation spaces may be referred to as accommodation space portions. The same is true of embodiments to be described later.

The angular velocity sensor element 31 included in the sensor device 100 includes a plurality of detection axes.

In X-, Y-, and Z-axes shown in the drawing, the angular velocity sensor element 31 includes an X-axis sensing unit 31X that detects the angular velocity around the X-axis, a Y-axis sensing unit 31Y that detects the angular velocity around the Y-axis, and a Z-axis sensing unit 31Z that detects the angular velocity around the Z-axis, and thus can detect angular velocities around the X-, Y-, and Z-axes. In addition, the acceleration sensor element 32 includes an X-direction sensing unit 32X that detects acceleration in an X-axis direction, a Y-direction sensing unit 32Y that detects acceleration in a Y-axis direction, and a Z-direction sensing unit 32Z that detects acceleration in a Z-axis direction, and thus can detect the acceleration in the X-, Y-, and Z-axis directions.

As shown in FIG. 1B, a first concave portion 10b is formed on the principal surface 10a side of the first base material 10 so as to correspond to each of the sensing units 31X, 31Y, and 31Z of the angular velocity sensor element 31. A second concave portion 10c is formed on the principal surface 10a side of the first base material 10 so as to correspond to each of the direction sensing units 32X, 32Y, and 32Z of the acceleration sensor element 32. The first concave portion 10b and the second concave portion 10c forma space portion in which driving units, not shown in the drawing, of the sensing units 31X, 31Y, 32Z, 32X, 32Y, and 32Z can operate. Meanwhile, in the sensor device 100 according to this embodiment, the first concave portion 10b and the second concave portion 10c of the first base material 10 are disposed independently with respect to each of the sensing units 31X, 31Y, 32Z, 32X, 32Y, and 32Z. However, for example, the first concave portions 10b may communicate with each other, and the second concave portions 10c may communicate with each other.

A sealing hole 20e is formed in the second concave portion 20c of the second base material 20 corresponding to the second accommodation space 100b, and the second accommodation space 100b is airtightly sealed by a second sealing member 62. That is, after the first base material 10 and the second base material 20 are bonded together in a decompression environment, the sensor device 100 is set to be in an atmospheric pressure environment, and gas components are introduced into the second accommodation space 100b from the sealing hole 20e. Thereafter, the sealing hole 20e is sealed with the second sealing member 62, and thus the second accommodation space 100b is airtightly sealed. In this embodiment, a solder ball is used as the second sealing member 62. The solder ball is irradiated with a laser and is melted to thereby airtightly seal the sealing hole 20e. A metal such as, Au, Ge, Zn, Sn, or Sb or an alloy thereof is used as the material of the solder ball, and an alloy of Au and Ge is preferably used.

As shown in FIG. 1A, the principal surface 10a of the first base material 10 and the principal surface 20a of the second base material 20 are anodically bonded together. A frame-like bonding region 40 indicated by dot hatching shown in FIG. 1A is provided. The bonding region 40 is provided with a first bonding region 41 on the first accommodation space 100a side, a second bonding region 42 on the second accommodation space 100b side, a third bonding region 43, a fourth bonding region 44, and a partition wall bonding region 45. The first bonding region and the second bonding region are disposed opposite to each other through the partition wall portion 20d. The third bonding region and the fourth bonding region are formed so as to intersect the bonding regions 41 and 42. The partition wall portion 20d of the second base material 20 is bonded to the partition wall bonding region. The bonding regions 41, 42, 43, and 44 contiguously constitute a frame-like bonding region. In addition, the accommodation space is further divided into the first accommodation space 100a and the second accommodation space 100b by the partition wall bonding region 45 extending to the fourth bonding region 44 from the third bonding region 43. In other words, the accommodation space is partitioned (divided) into the first accommodation space 100a and the second accommodation space 100b by the partition wall portion 20d.

The first base material 10 is provided with a drawing wiring in order to electrically connect an external electronic component not shown in the drawing, the angular velocity sensor element 31, and the acceleration sensor element 32. As shown in FIG. 1A, in the angular velocity sensor element 31, a plurality of wirings extend to the outside through the first bonding region 41, that is, in a direction of an arrow d1 shown in the drawing (hereinafter, referred to as a first direction d1) which is the Y (+) direction. A plurality of wirings 51 having a plurality of connection wirings 51a and a plurality of external connection terminals 51b connected to each other extend from the X-axis sensing unit 31X. A plurality of wirings 52 having a plurality of connection wirings 52a and a plurality of external connection terminals 52b connected to each other extend from the Y-axis sensing unit 31Y. A plurality of wirings 53 having a plurality of connection wirings 53a and a plurality of external connection terminals 53b connected to each other extend from the Z-axis sensing unit 31Z.

In the acceleration sensor element 32, a plurality of wirings extend to the outside through the second bonding region 42, that is, in a direction of an arrow d2 shown in the drawing (hereinafter, referred to as a second direction d2) which is the Y (−) direction. A plurality of wirings 54 having a plurality of connection wirings 54a and a plurality of external connection terminals 54b connected to each other extend from the X-direction sensing unit 32X. A plurality of wirings 55 having a plurality of connection wirings 55a and a plurality of external connection terminals 55b connected to each other extend from the Y-direction sensing unit 32Y. A plurality of wirings 56 having a plurality of connection wirings 56a and a plurality of external connection terminals 56b connected to each other extend from the Z-direction sensing unit 32Z.

FIG. 2A is an enlarged cross-sectional view of a portion B-B' of the sensor device 100 shown in FIG. 1A, FIG. 2B is an enlarged cross-sectional view of a portion C-C' of the sensor device 100 shown in FIG. 1A, and FIG. 2C is an enlarged cross-sectional view of a portion D-D' of the sensor device 100 shown in FIG. 1A.

As shown FIG. 2B, grooves 10d having the connection wirings 51a, 52a, and 53a disposed therein are formed on the principal surface 10a side of the first base material 10. An electric insulating material such as, for example, glass or silicon is used as the first base material 10. A raw base material of the angular velocity sensor element 31 is firmly fixed onto the principal surface 10a of the first base material 10, and the sensing units 31X, 31Y, and 31Z are formed for each axis using a MEMS technique. Accordingly, in a state where the wirings 51, 52, and 53 are formed on the principal surface 10a of the first base material 10, it is difficult to bond a raw base material of the angular velocity sensor element 31 onto the principal surface 10a of the first base material 10. For this reason, the grooves 10d are formed, and the wirings 51, 52, and 53 are formed on the respective bottom surfaces of the grooves 10d. In addition, the wirings 54, 55, and 56 are disposed on the respective bottom surfaces of the grooves 10d which are formed similarly.

As described above, the first base material 10 is formed of an electric insulating base material such as, for example, glass or silicon, and the second base material 20 is formed of a silicon base material. The first base material 10 and the second base material 20 are bonded together by anodic bonding in the bonding region 40 and maintain airtightness. However, as shown in FIG. 1A, the plurality of connection wirings 51a, 52a, 53a extend in the first direction d1 from the angular velocity sensor element 31 through the first bonding region 41 and are connected to the plurality of external connection terminals 51b, 52b, and 53b, respectively, and thus the plurality of wirings 51, 52, and 53 are disposed. Similarly, the connection wirings 54a, 55a, and 56a extend in the second direction d2 from the acceleration sensor element 32 through the second bonding region 42 and are connected to the plurality of external connection terminals 54b, 55b, and 56b, respectively, and thus the plurality of wirings 54, 55, and 56 are disposed.

As shown in FIGS. 2A and 2C, in intersection portions where the connection wirings 51a, 52a, and 53a disposed so as to intersect the first bonding region 41 and the connection wirings 54a, 55a, and 56a disposed so as to intersect the second bonding region 42 extend to the outside of the accommodation spaces 100a and 100b, gaps are generated between the principal surface 20a of the second base material 20 and the grooves 10d of the first base material 10 for disposing the wirings 51, 52, 53, 54, 55, and 56. In a state where the gaps are present, the sensor device 100 is airtightly sealed by the first sealing member 61 under a decompression environment, and thus the first accommodation space 100a is maintained in a decompression environment. On the other hand, as shown in FIG. 1B, since the second base material 20 includes the sealing hole 20e prior to the airtight sealing, the second accommodation space 100b returns to an atmospheric pressure environment after the airtight sealing is performed using the first sealing member 61. In addition, the sealing hole 20e mentioned above is airtightly sealed with the second sealing member 62 under an atmospheric pressure environment, and the second accommodation space 100b is maintained airtight.

The first sealing member 61 is formed of, for example, tetraethyl orthosilicate $(Si(OC_2H_5)_4)$ (TEOS) by a plasma CVD method, and the principal surface 20a of the second base material 20 is bonded thereto, and thus it is possible to seal a gap between the groove 10d and the principal surface 20a of the second base material 20. Meanwhile, the first sealing member 61 may be a metal oxide film having an electric insulating property, for example, $SiO_2$ or $Al_2O_3$.

As described above, the first base material 10 and the second base material 20 are anodically bonded together in the bonding region 40. The anodic bonding is a bonding method used as a method of bonding the first base material 10 formed of a glass base material to the second base material 20 formed of a silicon base material, which are included in the sensor device 100 according to this embodiment, while maintaining airtightness. In the anodic bonding, when the base materials are heated while applying a voltage of approximately 400 to 500 V thereto, covalent bonding occurs due to ions in glass moving to a bonding interface, and thus the base materials are firmly bonded together. However, a material different from that of the first base material 10 or the second base material 20 is used for the first sealing member 61 for filling and sealing the groove 10d of the first base material 10. Due to this, there is a concern of the bonding strength between the first base material 10 and the second base material 20 in a region where the first sealing member 61 is disposed, that is, the groove 10d falling below a bonding strength of a region where the principal surface 10a of the first base material 10 and the principal surface 20a of the second base material 20 are directly bonded together in the bonding region 40.

Figure 3A:
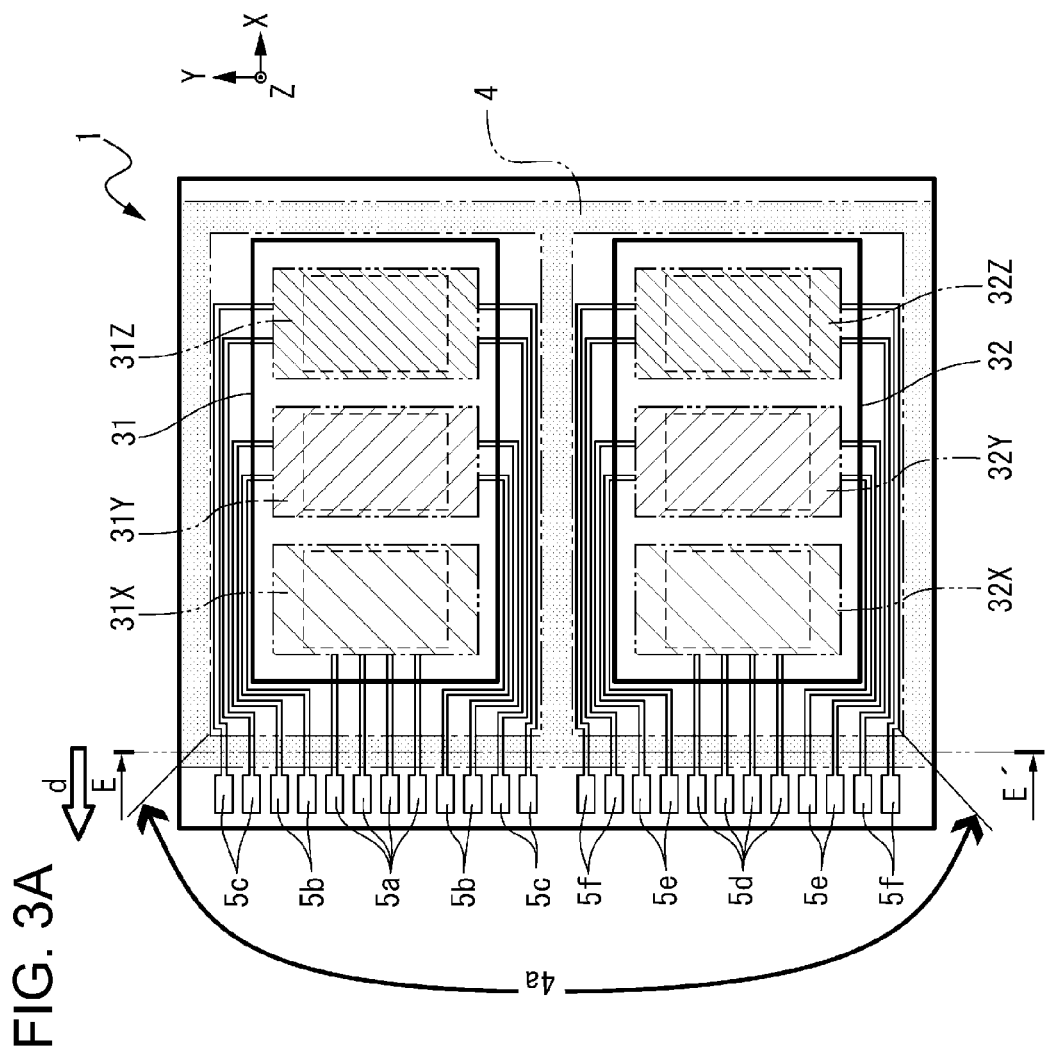
FIGS. 3A and 3B show a sensor device of the related art.
Figure 3B:
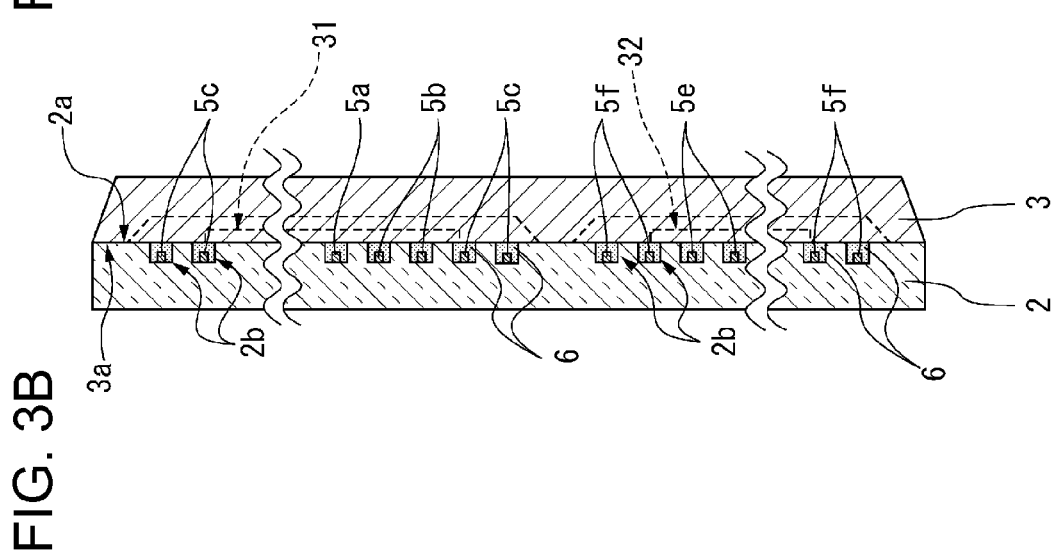

For example, as shown in FIG. 3A which is a plan view in a state where a second base material 3 is omitted, in the sensor device 1 of the related art which is shown in FIGS. 3A and 3B, all of the wirings 5a connected to the X-axis sensing unit 31X of the angular velocity sensor element 31, wirings 5b connected to the Y-axis sensing unit 31Y, and wirings 5c connected to the Z-axis sensing unit 31Z extend to the outside toward the X (−) direction, that is, a direction of an arrow d1 shown in the drawing in a first bonding region 4a so as to intersect the first bonding region 4a on one side in a bonding region 4 where a principal surface 2a of a first base material 2 and a principal surface 3a of the second base material 3, which are shown in FIG. 3B, are bonded together. Similarly, all of the wirings 5d connected to the X-direction sensing unit 32X of the acceleration sensor element 32, wirings 5e connected to the Y-direction sensing unit 32Y, and wirings 5f connected to the Z-direction sensing unit 32Z extend to the outside toward the X (−) direction, that is, a direction of an arrow d shown in the drawing in the first bonding region 4a so as to intersect the first bonding region 4a.

Accordingly, as shown in FIG. 3B which is a cross-sectional view of a cross-section of a portion of the first bonding region 4a shown in FIG. 3A (a cross-section of a portion E-E'), all of grooves 2b in which the respective wirings 5a, 5b, 5c, 5d, 5e, and 5f formed on the first base material 2 are disposed are disposed so as to be superimposed on the first bonding region 4a, and a bonding region between a sealing member 6 sealing the groove 2b and the principal surface 3a of the second base material 3 occupies most of the first bonding region 4a. That is, the above-mentioned anodic bonding region becomes narrow, and thus there is a concern of the bonding strength of the first bonding region 4a being decreased. A difference in bonding strength between the bonding regions is increased, and thus there is a concern of a bonding strength imbalance occurring. Due to this, when external load stress is applied to the sensor device 1, the bonding between the sealing member 6 and the principal surface 3a of the second base material 3 is broken, and thus there is a concern of an internal environment of the sensor device 1 being deteriorated. In addition, an uneven force is applied to the first base material 2 and the second base material 3, and thus warpage and stress occur in the first base material 2 and the second base material 3. For this reason, an unnecessary force propagates to the first functional element 31 and the second functional element 32, and initial stress increases in the functional elements, and thus there is a concern that the fundamental frequencies of the functional elements may be changed and that the sensitivity characteristics thereof may be influenced by temperature.

However, as described above, in the sensor device 100 according to this embodiment, the connection wirings 51a, 52a, and 53a connected to the angular velocity sensor element 31 extend in the first direction d1 to the outside through the first bonding region 41, and the connection wirings 54a, 55a, and 56a connected to the acceleration sensor element 32 extend in the second direction d2 to the outside through the second bonding region 42. That is, the wirings 51, 52, 53, 54, 55, and 56 disposed in the sensor device 100 are disposed so as to be divided into the first bonding region 41 and the second bonding region 42. Accordingly, the proportion of a bonding region between the principal surface 20a of the second base material 20 and the first sealing member 61 filled in the groove 10d of the first base material 10 in the first bonding region 41 and the second bonding region 42 is decreased, and thus it is possible to obtain a wide region where the principal surface 10a of the first base material 10 and the principal surface 20a of the second base material 20, which are anodically bonded together, are directly bonded together, that is, high bonding strength.

Further, as in the sensor device 100 according to this embodiment which is shown in FIG. 1A, the first accommodation space 100a and the second accommodation space 100b are disposed with the partition wall portion 20d interposed therebetween. That is, the connection wirings 51a, 52a, and 53a are disposed in the first bonding region 41 disposed in the first direction d1 with respect to the partition wall bonding region 45, and the connection wirings 54a, 55a, and 56a are disposed in the second bonding region 42 disposed in the second direction d2 with respect to the partition wall bonding region 45, and thus the number of wirings disposed in the first bonding region 41 is set to be substantially the same as the number of wirings disposed in the second bonding region 42 opposite to the first bonding region through the partition wall bonding region 45. Thereby, the bonding strength between the first bonding region 41 and the second bonding region 42 is balanced, and thus it is possible to distribute a well-balanced bonding strength of the bonding region 40.

In the sensor device 1 of the related art which is shown in FIG. 3A, the wirings 5c are drawn around over a long distance in the Z-axis sensing unit 31Z of the angular velocity sensor element 31 which is disposed farthest away from the first bonding region 4a. Similarly, the wirings 5f are drawn around over a long distance in the Z-direction sensing unit 32Z of the acceleration sensor element 32 which is disposed farthest away from the first bonding region 4a. However, in the sensor device 100 according to this embodiment which is shown in FIG. 1A, the connection wirings 51a, 52a, and 53a extend in the first direction d1 from the angular velocity sensor element 31 so as to intersect the first bonding region 41 which is located closest thereto, and the connection wirings 54a, 55a, and 56a extend in the second direction d2 from the acceleration sensor element 32 so as to intersect the second bonding region 42 which is located closest thereto. Accordingly, the connection wirings 51a, 52a, 53a, 54a, 55a and 56a extending from the sensor elements 31 and 32 can be disposed so as to be drawn around over a short distance, and thus it is possible to suppress a wiring resistance value generated in the connection wirings 51a, 52a, 53a, 54a, 55a, and 56a, to suppress parasitic capacitance to a low level, and to maintain the sensitivity of the sensor device 100 without decreasing the sensitivity.

Second Embodiment

Figure 4:
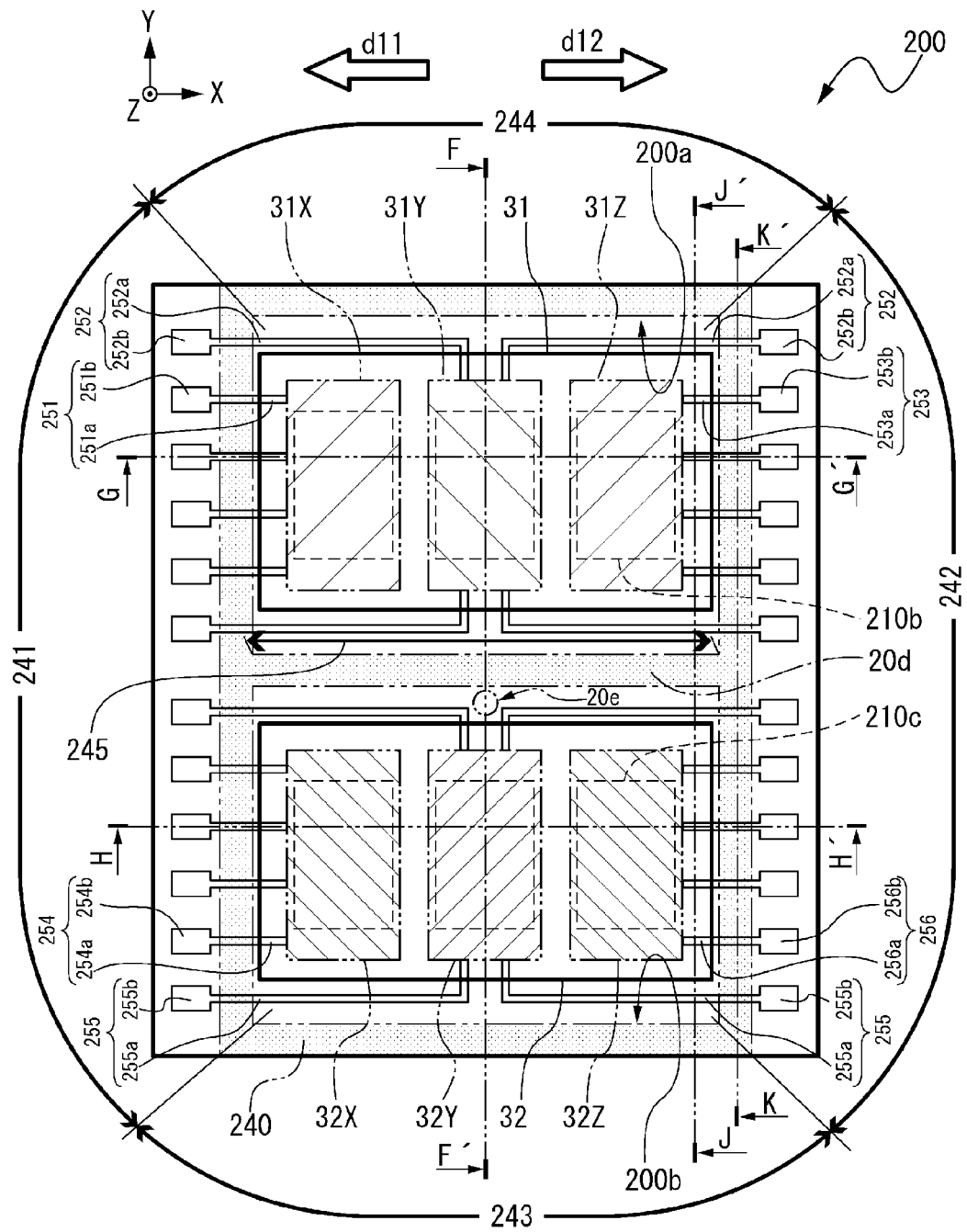
FIG. 4 is a plan view showing an electronic device according to a second embodiment in which a second base material is omitted.

FIG. 4 is a plan view in a state where a second base material of an electronic device according to a second embodiment is omitted. A sensor device 200 as the electronic device according to this embodiment which is shown in FIG. 4 is different from the sensor device according to the first embodiment in that the first bonding region 41 and the second bonding region 42 are disposed so as to intersect the partition wall bonding region 45 in the sensor device 100 and that the first direction d1 and the second direction d2 in which the wirings 51, 52, 53, 54, 55, and 56 extend are along the extension direction of the partition wall bonding region 45. Accordingly, the same components as those of the sensor device according to the first embodiment will be denoted by the same reference numerals and signs, and a description thereof will be omitted.

As shown in FIG. 5A which is a cross-sectional view of a portion F-F' shown in FIG. 4, a first accommodation space 200a is constituted by a principal surface 210a of a first base material 210 and a first concave portion 20b included in a second base material 20, and a second accommodation space 200b is constituted by the principal surface 210a of the first base material 210 and a second concave portion 20c included in the second base material 20. The first accommodation space 200a accommodates an angular velocity sensor element 31 as a first functional element, and the second accommodation space 200b accommodates an acceleration sensor element 32 as a second functional element. The sensor elements are bonded to the principal surface 210a of the first base material 210.

Similarly to the sensor device 100 according to the first embodiment mentioned above, the first accommodation space 200a accommodating the angular velocity sensor element 31 is maintained in a decompression environment, that is, a vacuum state, and the second accommodation space 200b accommodating the acceleration sensor element 32 is maintained in an atmospheric pressure environment filled with gas components as movable resistance, for example, air (nitrogen, oxygen, and the like) or an inert gas or a pressurized environment. In this manner, as shown in FIG. 4, the second accommodation space 200b includes a sealing hole 20e for airtightly sealing the second accommodation space 200b so that the first accommodation space 200a and the second accommodation space 200b are maintained in different internal environments. As shown in FIG. 5A, the sealing hole 20e is formed at least one location of the second base material 220 so as to communicate with the second accommodation space 200b, that is, so as to pass through the second concave portion 20c.

After the first base material 210 and the second base material 20 are bonded together in a decompression environment, the sensor device 200 is set to be in an atmospheric pressure environment, and gas components are introduced into the second accommodation space 200b from the sealing hole 20e, and then the sealing hole 20e is airtightly sealed by a second sealing member 62. In this embodiment, the second sealing member 62 airtightly seals the sealing hole 20e by irradiating a solder ball with a laser to melt the solder ball. A metal such as, Au, Ge, Zn, Sn, or Sb or an alloy thereof is used as a material of the solder ball, and an alloy of Au and Ge is preferably used.

Although not shown in the drawing, a metallization film is formed on the surface of a sealing hole 220e in order to obtain adhesiveness to the second sealing member 62, and a high adhesiveness to the metallization film by melting the second sealing member 62 of an AuGe solder ball under inert gas atmosphere, and thus it is possible to obtain a high degree of airtightness in the sealing hole 220e.

As shown in FIG. 5A, the sensor device 200 according to this embodiment includes a frame-like bonding region 240, indicated by dot hatching shown in FIG. 4, in which the principal surface 210a of the first base material 210 and the principal surface 20a of the second base material 20 are anodically bonded together. The bonding region 240 is provided with a first bonding region 241, a second bonding region 242, a third bonding region 243, a fourth bonding region 244, and a partition wall bonding region 245. The first bonding region and the second bonding region are disposed opposite to each other. The third bonding region and the fourth bonding region are disposed so as to intersect the bonding regions 241 and 242. A partition wall portion 20d of the second base material 20 is bonded to the partition wall bonding region 245. The bonding regions 241, 242, 243, and 244 contiguously constitute a frame-like bonding region.

In the sensor device 200 according to this embodiment, the first bonding region 241 and the second bonding region 242 are connected to each other so as to intersect the partition wall bonding region 245. In addition, the first accommodation space 200a and the second accommodation space 200b are formed by the partition wall bonding region 245 extending to the second bonding region 242 from the first bonding region 241.

A drawing wiring is disposed in the first base material 210 in order to electrically connect an external electronic component not shown in the drawing, the angular velocity sensor element 31, and the acceleration sensor element 32. As shown in FIG. 4, in the angular velocity sensor element 31, a plurality of wirings 251 having a plurality of connection wirings 251a for the input of a signal for exciting and driving an X-axis sensing unit 31X and for the output of an angular velocity detection signal which extend from the X-axis sensing unit 31X through the first bonding region 241 to the outside, that is, in a direction of an arrow d11 shown in the drawing (hereinafter, referred to as a first direction d11) which is the X (−) direction and a plurality of external connection terminals 251b that are connected to the connection wirings are disposed. Similarly, a plurality of wirings 252 having a plurality of connection wirings 252a for the input of a signal for exciting and driving a Y-axis sensing unit 31Y and for the output of an angular velocity detection signal which extend from the Y-axis sensing unit 31Y in the first direction d11 through the first bonding region 241 and to the outside, that is, in a direction of an arrow d12 shown in the drawing (hereinafter, referred to as a second direction d12) which is the X (+) direction through the second bonding region 242 and a plurality of external connection terminals 252b that are connected to the connection wirings are disposed. In addition, a plurality of wirings 253 having a plurality of connection wirings 253a for the input of a signal for exciting and driving a Z-axis sensing unit 31Z and for the output of an angular velocity detection signal which extend in the external second direction d12 from the Z-axis sensing unit 31Z through the second bonding region 242 and a plurality of external connection terminals 253b that are connected to the connection wirings are disposed.

In the acceleration sensor element 32, a plurality of wirings 254 having a plurality of connection wirings 254a for outputting an acceleration detection signal in the X direction which extend in the external first direction d11 from an X-direction sensing unit 32X through the first bonding region 241 and a plurality of external connection terminals 254b that are connected to the connection wirings are disposed. Similarly, a plurality of wirings 255 having a plurality of connection wirings 255a for outputting an acceleration detection signal in the Y direction which extend in the external first direction d11 from a Y-direction sensing unit 32Y through the first bonding region 241 and in the external second direction d12 from a Y-direction sensing unit through the second bonding region 242 and a plurality of external connection terminals 255b that are connected to the connection wirings are disposed. In addition, a plurality of wirings 256 having a plurality of connection wirings 256a for outputting an acceleration detection signal in a Z direction which extend in the external second direction d12 from a Z-direction sensing unit 32Z through the second bonding region 242 and a plurality of external connection terminals 256b that are connected to the connection wirings are disposed.

That is, the wirings 251, 252, 253, 254, 255, and 256 connected to the angular velocity sensor element 31 and the acceleration sensor element 32 extend so as to be divided into the external first direction d11 through the first bonding region 241 and the external second direction d12 through the second bonding region 242. In other words, the connection terminals 251b, 252b, 253b, 254b, 255b, and 256b are disposed so as to be divided into the extension direction of the first bonding region 241 and the extension direction of the second bonding region 242.

FIG. 5B is a cross-sectional view of a portion G-G' and a portion H-H' shown in FIG. 4. Meanwhile, a cross-sectional configuration of the portion H-H' is the same as a cross-sectional configuration of the portion G-G', and thus a cross-sectional portion of the portion G-G' will be described as an example.

As shown in FIG. 5B, the principal surface 210a of the first base material 210 and the principal surface 20a of the second base material 20 are connected to each other in the bonding region 240, and the first accommodation space 200a is formed by the first concave portion 20b of the second base material 20. In addition, first concave portions 210b corresponding to respective driving units (movable units) included in the sensing units 31X, 31Y, and 31Z of the angular velocity sensor element 31 are formed on the principal surface 210a side of the first base material 210. Similarly, the principal surface 210a of the first base material 210 and the principal surface 20a of the second base material 20 are connected to each other in the bonding region 240, and a second accommodation space 200b is formed by the second concave portion 20c of the second base material 20. In addition, second concave portions 210c corresponding to respective driving units (movable units) included in the direction sensing unit 32X, 32Y, and 32Z of the acceleration sensor element 32 are formed on the principal surface 220a side of the first base material 210.

FIG. 6A is a cross-sectional view of a portion J-J' shown in FIG. 4. As shown in FIG. 6A, the wirings 251, 252, 253, 254, 255, and 256 for electrically connecting the sensor elements 31 and 32 described in FIG. 4 and an external electronic component not shown in the drawing are drawn around in the first base material 210. Although described in the sensor device 100 according to the first embodiment, grooves 210d having the connection wirings 252a, 253a, 255a, and 256a disposed therein are formed on the principal surface 210a side of the first base material 210. An electric insulating material such as, for example, glass or silicon is used as the first base material 210. Raw material substrates of the angular velocity sensor element 31 and the acceleration sensor element 32 are firmly fixed onto the principal surface 210a of the first base material 210, and the sensing units 31X, 31Y, 31Z, 32X, 32Y, and 32Z are formed for each axis using a MEMS technique. Accordingly, in a state where the wirings 251, 252, 253, 254, 255, and 256 are formed on the principal surface 210a of the first base material 210, it is difficult to bond the raw material substrates of the angular velocity sensor element 31 and the acceleration sensor element 32 onto the principal surface 210a of the first base material 210. For this reason, the grooves 210d are formed, and the wirings 251, 252, 253, 254, 255, and 256 are formed on the respective bottom surfaces of the grooves 210d.

As described above, the first base material 210 is formed of an electric insulating base material such as, for example, glass or silicon, and the second base material 20 is formed of a silicon base material. The first base material 210 and the second base material 20 are bonded together by anodic bonding in the bonding region 240 and maintain airtightness. However, as shown in FIG. 4, in the case of the angular velocity sensor element 31, the plurality of connection wirings 251a extend in the external first direction d11 from the X-axis sensing unit 31X through the first bonding region 241 and are connected to the plurality of external connection terminals 251b, and thus the plurality of wirings 251 are disposed. Similarly, the plurality of connection wirings 252a extend in the external first direction d11 from the Y-axis sensing unit 31Y through the first bonding region 241 and in the external second direction d12 from the Y-axis sensing unit through the second bonding region 242 and are connected to the plurality of external connection terminals 252b, and thus the plurality of wirings 252 are disposed. In addition, the connection wirings 253a extend in the external second direction d12 from the Z-axis sensing unit 31Z through the second bonding region 242 and are connected to the plurality of external connection terminals 253b, and thus the plurality of wirings 253 are disposed.

Similarly, also in the case of the acceleration sensor element 32, the plurality of connection wirings 254a extend in the external first direction d11 from the X-direction sensing unit 32X through the first bonding region 241 and are connected to the plurality of external connection terminals 254b, and thus the plurality of wirings 254 are disposed. Similarly, the plurality of connection wirings 255a extend in the external first direction d11 from the Y-direction sensing unit 32Y through the first bonding region 241 and in the external second direction d12 from the Y-direction sensing unit through the second bonding region 242 and are connected to the plurality of external connection terminals 255b, and thus the plurality of wirings 255 are disposed. In addition, the connection wirings 256a extend in the external second direction d12 from the Z-direction sensing unit 32Z through the second bonding region 242 and are connected to the plurality of external connection terminals 256b, and thus the plurality of wirings 256 are disposed.

As shown in FIG. 5B and FIG. 6B which is a cross-sectional view of a portion K-K' shown in FIG. 4, in intersection portions where the connection wirings 251a, 252a, 253a, 254a, 255a, and 256a extend to the outside of the accommodation spaces 200a and 200b so as to intersect the first bonding region 241 and the second bonding region 242, gaps are generated between the principal surface 20a of the second base material 20 and the grooves 210d. In a state where the gaps are present, the sensor device 200 is airtightly sealed by the first sealing member 261 under a decompression environment, and thus the first accommodation space 200a is maintained in a decompression environment. On the other hand, as described above, since the second base material 20 includes the sealing hole 20e prior to the airtight sealing, the second accommodation space 200b returns to an atmospheric pressure environment after the airtight sealing using the first sealing member 261. In addition, the sealing hole 20e mentioned above is airtightly sealed by the second sealing member 62 under an atmospheric pressure environment, and the second accommodation space 200b is maintained airtight.

The first sealing member 261 is formed of, for example, tetraethyl orthosilicate ($Si(OC_2H_5)_4$) (TEOS) by a plasma CVD method, and the principal surface 20a of the second base material 20 is bonded thereto, and thus it is possible to seal a gap between the groove 210d and the principal surface 20a of the second base material 20. Meanwhile, the first sealing member 261 may be a metal oxide film having an electric insulating property, for example, $SiO_2$ or $Al_2O_3$.

Similarly to the sensor device 100 according to the first embodiment, also in the sensor device 200 according to this embodiment, there is a concern that the bonding strength between the first base material 210 and the second base material 20 in a region where the first sealing member 261 is disposed, that is, the groove 210d may fall below a bonding strength of a region where the principal surface 210a of the first base material 210 and the principal surface 20a of the second base material 20 are directly bonded together in the bonding region 240. Further, in the sensor device 200 according to this embodiment, a composite sensor device constituted by the angular velocity sensor element 31 and the acceleration sensor element 32 is configured as a functional element, and the number of wirings 251, 252, 253, 254, 255, and 256 which are connected to the respective sensor elements 31 and 32 and extend to the outside so as to intersect the bonding region 240 is increased, and thus a bonding region between the first sealing member 261, the first base material 210, and the second base material 20 is also increased.

Consequently, as in the sensor device 200 shown in FIG. 4, substantially the same number of connection wirings 251a, 252a, 253a, 254a, 255a, and 256a are disposed in the first bonding region 241 and the second bonding region 242. Thereby, the bonding strength between the first bonding region 241 and the second bonding region 242 is balanced, and thus it is possible to distribute a well-balanced bonding strength of the bonding region 240.

In addition, as shown in FIG. 4, the first bonding region 241 and the second bonding region 242 are disposed opposite to each other through the first accommodation space 200a and the second accommodation space 200b, and the wirings 251, 252, 253, 254, 255, and 256 are disposed toward the first direction d11 and the second direction d12 which are mutually opposite directions, and thus the bonding region 240 having a well-balanced bonding strength is disposed. Accordingly, a balance of the bonding strength of the entire bonding region 240 is suitably maintained, and thus it is possible to maintain a stable and high degree of airtightness in the accommodation spaces 200a and 200b.

Meanwhile, in the sensor device 100 according to the first embodiment and the sensor device 200 according to the second embodiment, a description has been given of a configuration in which two types of the functional elements, that is, the angular velocity sensor element 31 and the acceleration sensor element 32 are provided, but the invention is not limited thereto. For example, three or more types of functional elements may be provided, or a plurality of the same functional elements may be provided.

Third Embodiment

Figure 7A:
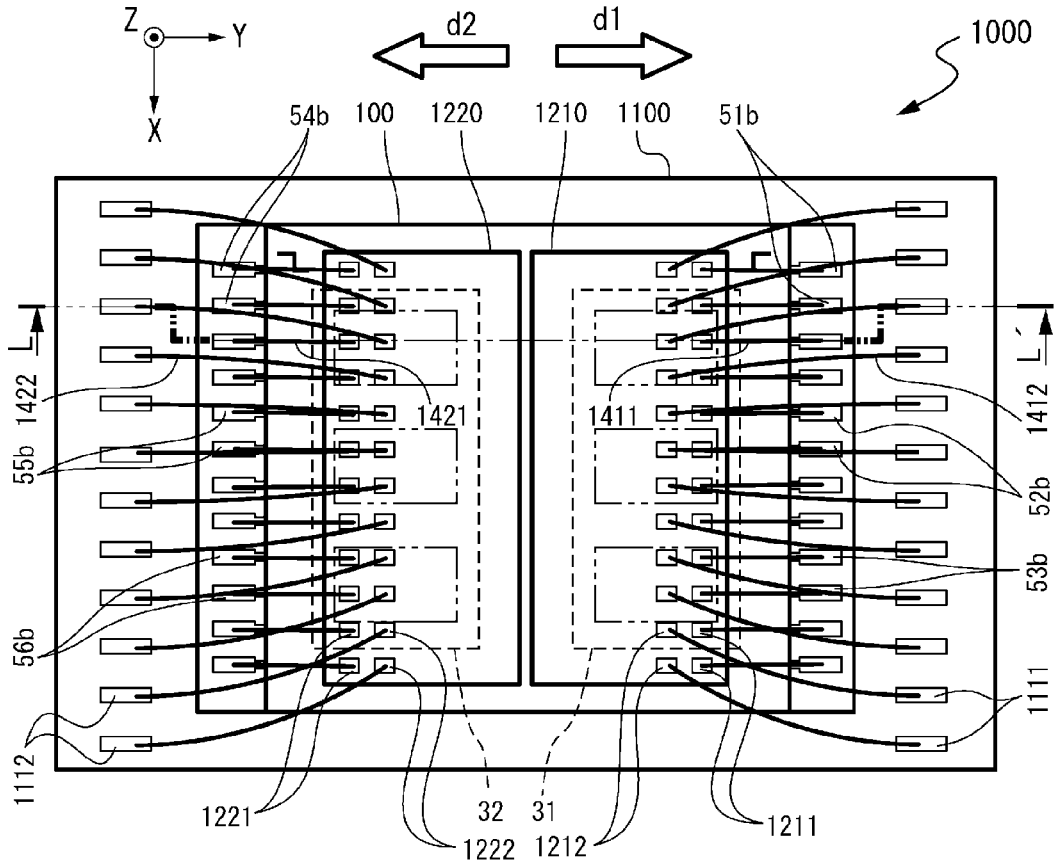
FIGS. 7A and 7B show an electronic module according to a third embodiment.
Figure 7B:
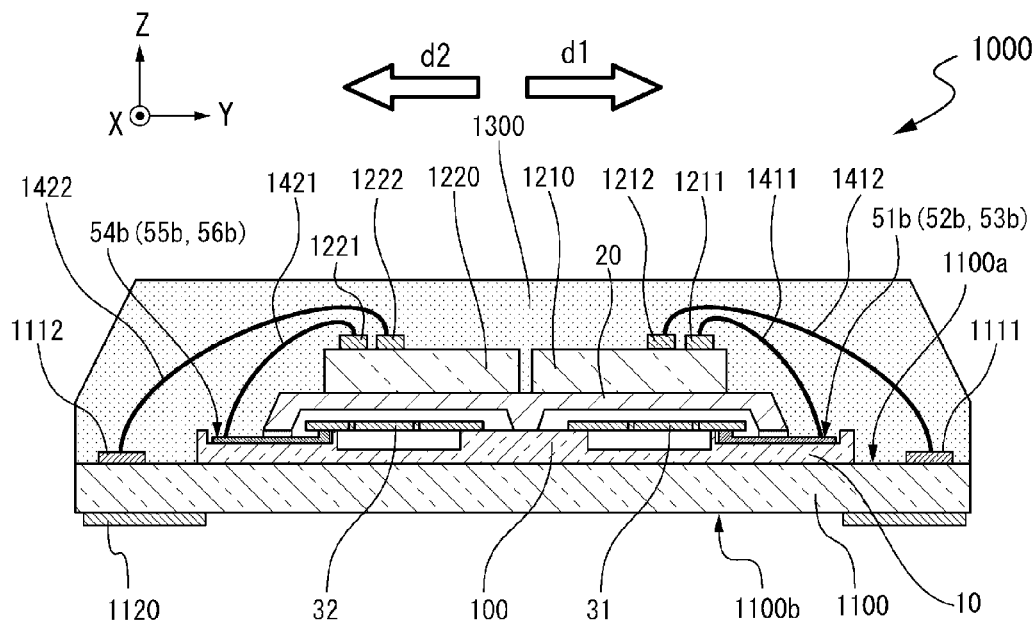

FIGS. 7A and 7B show an electronic module according to a third embodiment. FIG. 7A is a plan view in which a mold member is omitted, and FIG. 7B is a cross-sectional view of a portion L-L' shown in FIG. 7A. An electronic module 1000 shown in FIGS. 7A and 7B includes the sensor device 100, according to the first embodiment, which is bonded to a base substrate 1100 and includes an angular velocity sensor element 31 as a first functional element which detects angular velocities around three axes and an acceleration sensor element 32 as a second functional element which detects acceleration in three axial directions.

Further, a first semiconductor element 1210 and a second semiconductor element 1220 are bonded onto the second base material 20 of the sensor device 100 using a bonding member such as, for example, an epoxy-based adhesive. The first semiconductor element 1210 includes at least a driving circuit unit, not shown in the drawing, which drives the angular velocity sensor element 31 included in the sensor device 100 and an angular velocity computation circuit unit, not shown in the drawing, which computes an angular velocity based on a detected signal from the angular velocity sensor element 31. In addition, the second semiconductor element 1220 includes at least an acceleration computation circuit unit, not shown in the drawing, which computes an acceleration based on a detected signal from an acceleration sensor element 32 included in the sensor device 100.

The first semiconductor element 1210 and the second semiconductor element 1220 are disposed at relative positions with respect to the sensor device 100 in a first direction d1 and a second direction d2 which are shown in the drawing, respectively, and are bonded together. That is, in this embodiment, the first semiconductor element 1210 is disposed so as to overlap the first accommodation space 100a (see FIGS. 1A and 1B) accommodating the angular velocity sensor element 31 as a first functional element when seen in a plan view (when seen in the direction of an arrow in a Z-axis direction shown in the drawing), and the second semiconductor element 1220 is disposed so as to overlap the second accommodation space 100b (see FIGS. 1A and 1B) accommodating the acceleration sensor element 32 as a second functional element when seen in a plan view. A mold member 1300 is formed so as to cover the semiconductor elements 1210 and 1220 and the sensor device 100 included in the base substrate 1100.

As shown in FIG. 7A, the base substrate 1100 is a plate-like substrate having a rectangular plane and is preferably an electric insulating substrate, for example, a ceramic substrate, an epoxy resin substrate, a printed board, or the like. In the electronic module 1000 according to this embodiment, a ceramic base substrate 1100 will be described as an example. The sensor device 100 is bonded onto a surface 1100*a* (hereinafter, referred to as a mounting surface 1100*a*) of the base substrate 1100 having the sensor device 100 mounted thereon and bonded thereto, using an epoxy-based resin adhesive or the like. In addition, a plurality of first substrate connection terminals 1111 and a plurality of second substrate connection terminals 1112 are formed on the mounting surface 1100*a*, and an external connection terminal 1120 for connection with an electrode included in an external substrate not shown in the drawing is formed on an outer surface 1100*b* serving as a surface opposite to the mounting surface 1100*a*. Meanwhile, the first substrate connection terminals 1111 and the second substrate connection terminals 1112 are electrically connected to the external connection terminal 1120 through a wiring not shown in the drawing which is formed within the base substrate 1100.

The first semiconductor element 1210 includes a plurality of connection pads 1211 which are electrically connected to the connection terminals 51*b*, 52*b*, and 53*b* of the wirings 51, 52, and 53, connected to the angular velocity sensor element 31 included in the sensor device 100, through bonding wires 1411. Further, the first semiconductor element includes a plurality of connection pads 1212 which are electrically connected to the first substrate connection terminals 1111 through bonding wires 1412. As shown in the drawing, in the electronic module 1000, the connection pads 1211 and 1212 are disposed lined up on a side of a first direction d1 which is an extension direction of the wirings 51, 52, and 53 connected to the angular velocity sensor element 31, along an extension direction of a first bonding region 41, that is, the X direction (see FIGS. 1A and 1B).

The second semiconductor element includes a plurality of connection pads 1221 which are electrically connected to connection terminals 54*b*, 55*b*, and 56*b* of wirings 54, 55, and 56 connected to the acceleration sensor element 32 included in the sensor device 100, through a bonding wire 1421. Further, the second semiconductor element includes a plurality of connection pads 1222 which are electrically connected to the second substrate connection terminal 1112 through a bonding wire 1422. As shown in the drawing, in the electronic module 1000, the connection pads 1212 and 1222 are disposed line up on a side of a second direction d2 which is an extension direction of the wirings 54, 55, and 56 connected to the acceleration sensor element 32, along an extension direction of a second bonding region 42, that is, the X direction (see FIGS. 1A and 1B).

As described above, in the electronic module 1000 according to this embodiment, the connection pads 1211 and 1212 included in the first semiconductor element 1210 and the first substrate connection terminals 1111 included in the base substrate 1100 are disposed at locations close to the connection terminals 51*b*, 52*b*, and 53*b* included in the wirings 51, 52, and 53 which are connected to the angular velocity sensor element 31 as a first functional element and extend in the first direction d1, in the sensor device 100 according to the first embodiment which is included in the electronic module 1000. Thereby, it is possible to further reduce the length of the bonding wire 1411 that connects each of the connection terminals 51*b*, 52*b*, and 53*b* and the connection pad 1211. Further, it is also possible to further reduce the length of the bonding wire 1412 that connects the connection pad 1212 and the first substrate connection terminal 1111.

Similarly, the connection pads 1221 and 1222 included in the second semiconductor element 1220 and the second substrate connection terminals 1112 included in the base substrate 1100 are disposed at locations close to the connection terminals 54*b*, 55*b*, and 56*b* included in the wirings 54, 55, and 56 which are connected to the acceleration sensor element 32 as a second functional element and extend in the direction d2. Thereby, it is possible to further reduce the length of the bonding wire 1421 that connects each of the connection terminals 54*b*, 55*b*, and 56*b* and the connection pad 1221. Further, it is also possible to further reduce the length of the bonding wire 1422 that connects the connection pad 1222 and the second substrate connection terminal 1112.

In this manner, the lengths of the bonding wires 1411, 1412, 1421, and 1422 can be reduced, and thus it is possible to suppress the electric resistance of the bonding wires 1411, 1412, 1421, and 1422 and parasitic capacitance. Therefore, it is possible to obtain the electronic module 1000 which is stable and has high accuracy. Meanwhile, an example in which the electronic module 1000 according to this embodiment includes the sensor device 100 has been described, but may include the sensor device 200 according to the second embodiment.

Fourth Embodiment

Figure 8A:
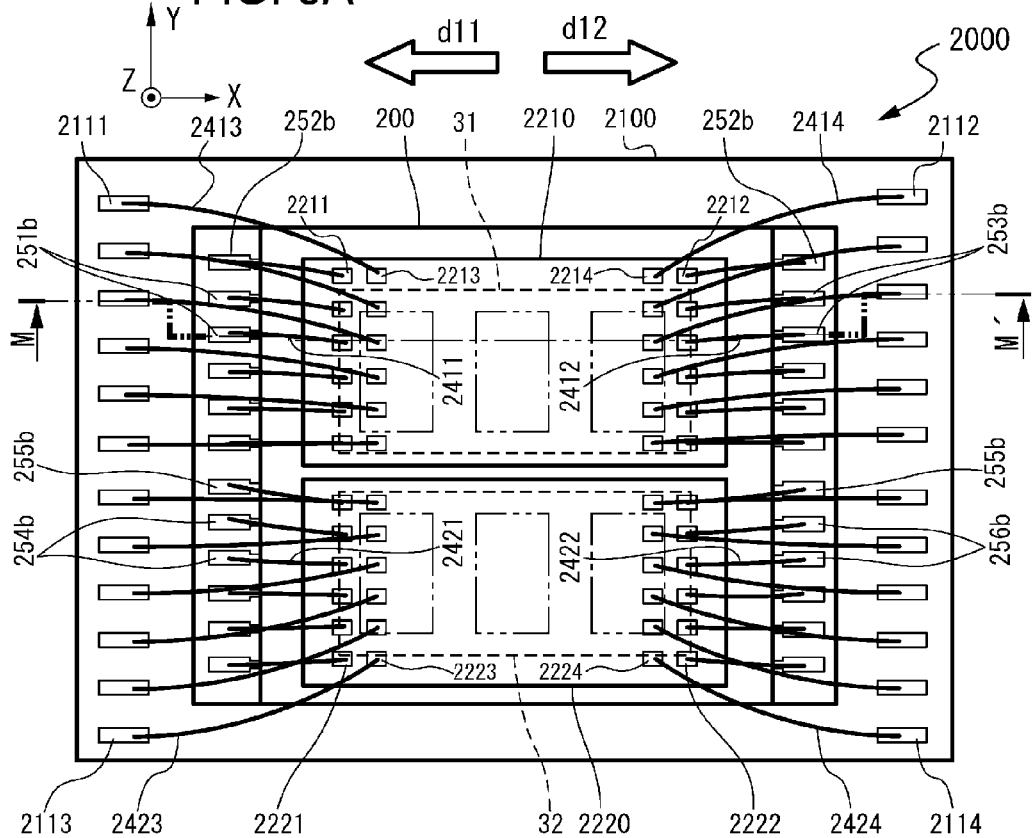
FIGS. 8A and 8B show an electronic module according to a fourth embodiment.
Figure 8B:
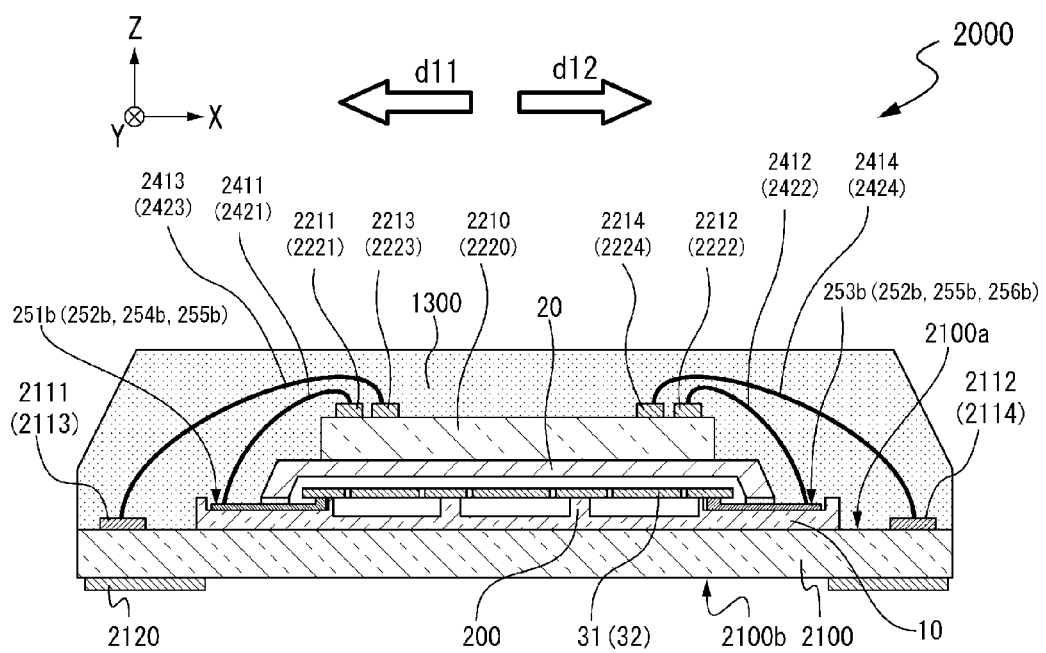

FIGS. 8A and 8B show an electronic module according to a fourth embodiment. FIG. 8A is a plan view in which a mold member is omitted, and FIG. 8B is a cross-sectional view of a portion M-M' shown in FIG. 8A. An electronic module 2000 shown in FIGS. 8A and 8B includes the sensor device 200, according to the second embodiment, which is bonded to a base substrate 2100 and includes an angular velocity sensor element 31 as a first functional element which detects angular velocities around three axes and an acceleration sensor element 32 as a second functional element which detects acceleration in three axial directions.

Further, a first semiconductor element 2210 and a second semiconductor element 2220 are bonded together using a bonding member such as, for example, an epoxy-based adhesive on a second base material 20 of the sensor device 200. The first semiconductor element 2210 includes at least a driving circuit unit, not shown in the drawing, which drives an angular velocity sensor element 31 included in the sensor device 200 and an angular velocity computation circuit unit, not shown in the drawing, which computes an angular velocity based on a detected signal from the angular velocity sensor element 31. In addition, the second semiconductor element 2220 includes at least an acceleration computation circuit unit, not shown in the drawing, which computes an acceleration based on a detected signal from an acceleration sensor element 32 included in the sensor device 200.

In the arrangements of the first semiconductor element 2210 and the second semiconductor element 2220 with respect to the sensor device 200 of this embodiment, the first semiconductor element 2210 is disposed so as to overlap the first accommodation space 200*a* (see FIG. 4) accommodating the angular velocity sensor element 31 as a first functional element when seen in a plan view (when seen in the direction of an arrow in a Z-axis direction shown in the drawing), and the second semiconductor element 2220 is disposed so as to overlap the second accommodation space 200*b* (see FIG. 4) accommodating the acceleration sensor element 32 as a second functional element when seen in a plan view. A mold member 1300 is formed so as to cover the semiconductor elements 2210 and 2220 and the sensor device 200 included in the base substrate 2100.

As shown in FIG. 8A, the base substrate 2100 is a plate-like substrate having a rectangular plane and is preferably an electric insulating substrate, for example, a ceramic substrate, an epoxy resin substrate, or the like. In the electronic module 2000 according to this embodiment, a ceramic base substrate 2100 will be described as an example. The sensor device 200 is bonded onto a surface 2100a (hereinafter, referred to as a mounting surface 2100a) of the base substrate 2100 using an epoxy-based resin adhesive or the like. In addition, a plurality of first substrate connection terminals 2111, a plurality of second substrate connection terminals 2112, a plurality of third substrate connection terminals 2113, and a plurality of fourth substrate connection terminals 2114 are formed on the mounting surface 2100a, and an external connection terminal 2120 for connection with an electrode included in an external substrate not shown in the drawing is formed on an outer surface 2100b serving as a surface opposite to the mounting surface 2100a. Meanwhile, the first substrate connection terminals 2111, the second substrate connection terminals 2112, the third substrate connection terminals 2113, and the fourth substrate connection terminals 2114 are electrically connected to the external connection terminal 2120 through a wiring not shown in the drawing which is formed within the base substrate 2100.

The first semiconductor element 2210 includes a plurality of connection pads 2211 and 2212 which are electrically connected to connection terminals 251b, 252b, and 253b of wirings 251, 252, and 253, connected to the angular velocity sensor element 31 included in the sensor device 200, through bonding wires 2411 and 2412. As described above, in the sensor device 200 according to the second embodiment, the wirings 251 connected to the angular velocity sensor element 31 and some of the wirings 252 extend in the first direction d11 shown in the drawing, and the connection terminals 251b and some of the connection terminals 252b are disposed lined up along the Y direction on the first direction d11 side of the sensor device 200. The wirings 253 connected to the angular velocity sensor element 31 and some of the wirings 252 extend in the second direction d12 shown in the drawing, and the connection terminals 253b and some of the connection terminals 252b are disposed lined up along the Y direction on the second direction d12 side of the sensor device 200.

The connection pads 2211 included in the first semiconductor element 2210 are disposed lined up on the first direction d11 side of the first semiconductor element 2210 along the arrangement of the connection terminals 251b disposed lined up along the Y direction in the first direction d11 and the arrangement of some of the connection terminals 252b. In addition, the connection pads 2212 included in the first semiconductor element 2210 are disposed lined up on the second direction d12 side of the first semiconductor element 2210 along the arrangement of the connection terminals 253b disposed lined up along the Y direction in the second direction d12 and the arrangement of some of the connection terminals 252b. The connection terminals 251b of the sensor device 200 which are disposed on the first direction d11 side and some of the connection terminals 252b are electrically connected to the connection pads 2211 through the bonding wires 2411, and the connection terminals 253b and some of the connection terminals 252b are electrically connected to the connection pads 2212 through the bonding wires 2412.

Further, in the first semiconductor element 2210, connection pads 2213 are disposed along the connection pads 2211, and connection pads 2214 are disposed along the connection pads 2212. The connection pads 2213 are electrically connected to the respective first substrate connection terminals 2111 disposed outside the sensor device 200 in the first direction d11 through bonding wires 2413, and the connection pads 2214 are electrically connected to the respective second substrate connection terminals 2112 disposed outside the sensor device 200 in the second direction d12 through bonding wires 2414.

Similarly, the second semiconductor element 2220 includes a plurality of connection pads 2221 and 2222 which are, through bonding wires 2421 and 2422, electrically connected to the connection terminals 254b, 255b, and 256b of the wirings 254, 255, and 256 connected to the acceleration sensor element 32 included in the sensor device 200. As described above, in the sensor device 200 according to the second embodiment, the wirings 254 connected to the acceleration sensor element 32 and some of the wirings 255 extend in the first direction d11 shown in the drawing, and the connection terminals 254b and some of the connection terminals 255b are disposed lined up along the Y direction on the first direction d11 side of the sensor device 200. In addition, the wirings 256 connected to the acceleration sensor element 32 and some of the wirings 255 extend in the second direction d12 shown in the drawing, and the connection terminals 256b and some of the connection terminals 255b are disposed lined up along the Y direction on the second direction d12 side of the sensor device 200.

The connection pads 2221 included in the second semiconductor element 2220 are disposed lined up on the first direction d11 side of the second semiconductor element 2220 along the arrangement of the connection terminals 255b disposed lined up along the Y direction in the first direction d11 and the arrangement of some of the connection terminals 256b. In addition, the connection pads 2222 included in the second semiconductor element 2220 are disposed lined up on the second direction d12 side of the second semiconductor element 2220 along the arrangement of the connection terminals 256b disposed lined up along the Y direction in the second direction d12 and the arrangement of some of the connection terminals 255b. In addition, the connection terminal 254b of the sensor device 200 disposed on the first direction d11 side and some of the connection terminals 255b are electrically connected to the connection pads 2221 through the bonding wires 2421, and the connection terminals 256b and some of the connection terminals 255b are electrically connected to the connection pads 2222 through the bonding wires 2422.

Further, in the second semiconductor element 2220, connection pads 2223 are disposed along the connection pads 2221, and connection pads 2224 are disposed along the connection pads 2222. The connection pads 2223 are electrically connected to the respective third substrate connection terminals 2113 disposed outside the sensor device 200 in the first direction d11 through bonding wires 2423, and the connection pads 2224 are electrically connected to the respective fourth substrate connection terminals 2114 disposed outside the sensor device 200 in the second direction d12 through bonding wires 2424.

As described above, in the electronic module 2000 according to this embodiment, the connection pads 2211 and 2213 included in the first semiconductor element 2210 and the first substrate connection terminals 2111 included in the base substrate 2100 are disposed at locations close to the connection terminals 251b and some of the connection terminals 252b which are respectively included in the wirings 251, connected to the angular velocity sensor element 31 as a first functional element and extend in the first direction d11, and some of the wirings 252, in the sensor device 200 according to the second embodiment which is included in the electronic module 2000. Thereby, it is possible to further reduce the lengths of the bonding wires 2411 and 2413 that electrically connect the connection terminals and the connection pads.

Similarly, it is possible to reduce the lengths of the bonding wires 2412 and 2414 also on the second direction d12 side. Also in the second semiconductor element 2220, it is possible to reduce the lengths of the bonding wires 2421 and 2423 disposed on the first direction d11 side and the lengths of the bonding wires 2422 and 2424 disposed on the second direction d12 side.

In this manner, the lengths of the bonding wires 2411, 2412, 2413, 2414, 2421, 2422, 2423, and 2424 can be reduced, and thus it is possible to suppress the electric resistance of the bonding wires 2411, 2412, 2413, 2414, 2421, 2422, 2423, and 2424 and parasitic capacitance. Therefore, it is possible to obtain the electronic module 2000 which is stable and has high accuracy.

In the third and fourth embodiments, the semiconductor element is provided on a surface opposite to the accommodation space side of the second base material 20, but is not limited thereto. For example, the semiconductor element may be provided on a surface opposite to the accommodation space side of the first base material 10. In addition, the semiconductor element may be provided on the base substrate 1100. The electrical connection between the connection terminal and the semiconductor element is not limited to a bonding wire, and may use a lead frame, a bump, and the like.

Fifth Embodiment

As an electronic apparatus according to a fifth embodiment, a smartphone and a digital still camera including the sensor device 100 according to the first embodiment, the sensor device 200 according to the second embodiment, the electronic module 1000 according to the third embodiment, or the electronic module 2000 according to the fourth embodiment will be described.

Figure 9:
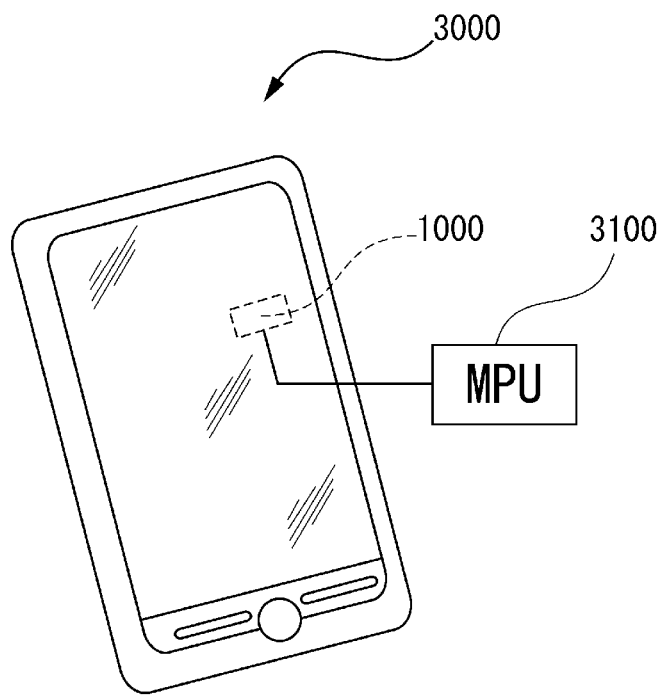
FIG. 9 is a diagram showing the exterior of a smartphone as an electronic apparatus according to a fifth embodiment.

FIG. 9 is a diagram showing the exterior of a smartphone 3000. The electronic module 1000 according to the third embodiment which detects the posture of the smartphone 3000 is embedded in the smartphone 3000. So-called motion sensing is performed by the electronic module 1000 being embedded, and thus it is possible to detect the posture of the smartphone 3000. A detected signal of the electronic module 1000 is supplied to, for example, a microcomputer chip 3100 (hereinafter, referred to as a MPU 3100), and the MPU 3100 can perform various processes in accordance with the motion sensing. In addition, the motion sensing can be used by embedding the electronic module 1000 in an electronic apparatus such as a mobile phone, a portable game machine, a game controller, a car navigation system, a pointing system, a head mounting display, or a tablet PC.

Figure 10:
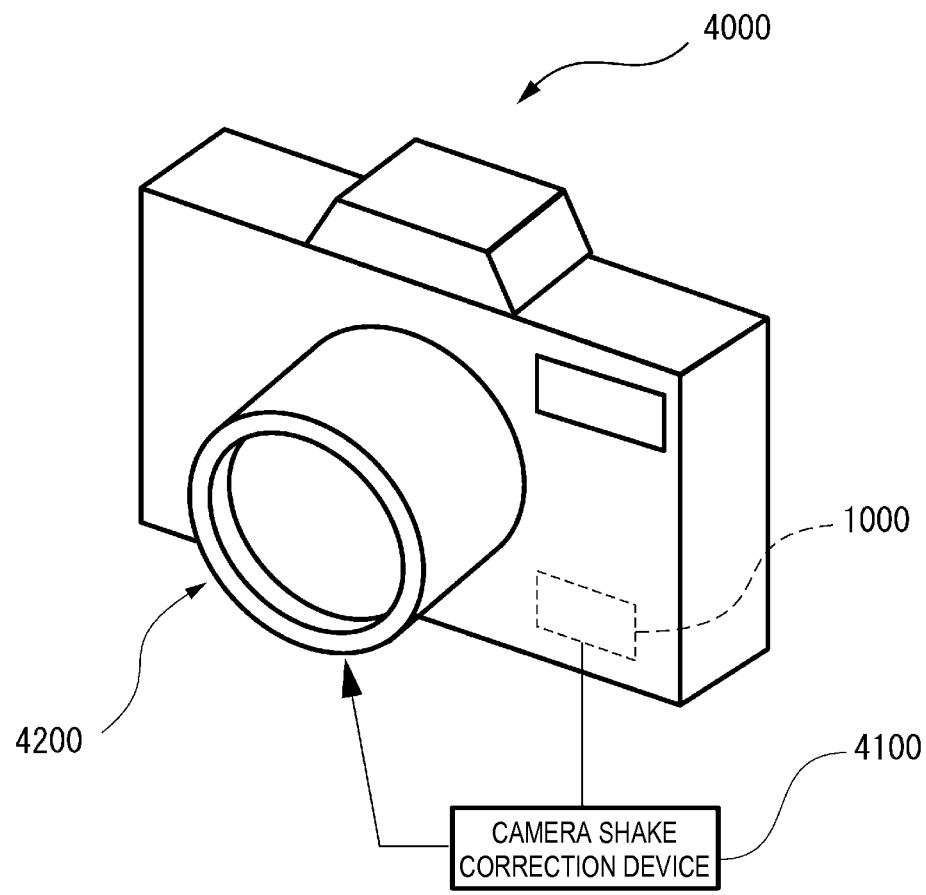
FIG. 10 is a diagram showing the exterior of a digital still camera as an electronic apparatus according to the fifth embodiment.

FIG. 10 is a diagram showing the exterior of a digital still camera 4000 (hereinafter, referred to as a camera 4000). The electronic module 1000 according to the third embodiment which detects the posture of the camera 4000 is embedded in the camera 4000. A detected signal of the embedded electronic module 1000 is supplied to a camera shake correction device 4100. For example, the camera shake correction device 4100 may move a specific lens within a lens set 4200 in accordance with the detected signal of the electronic module 1000 to thereby suppress an image defect due to a camera shake. In addition, the electronic module 1000 and the camera shake correction device 4100 are embedded in a digital video camera, and thus it is possible to correct a camera shake, similar to the camera 4000.

Sixth Embodiment

Figure 11:
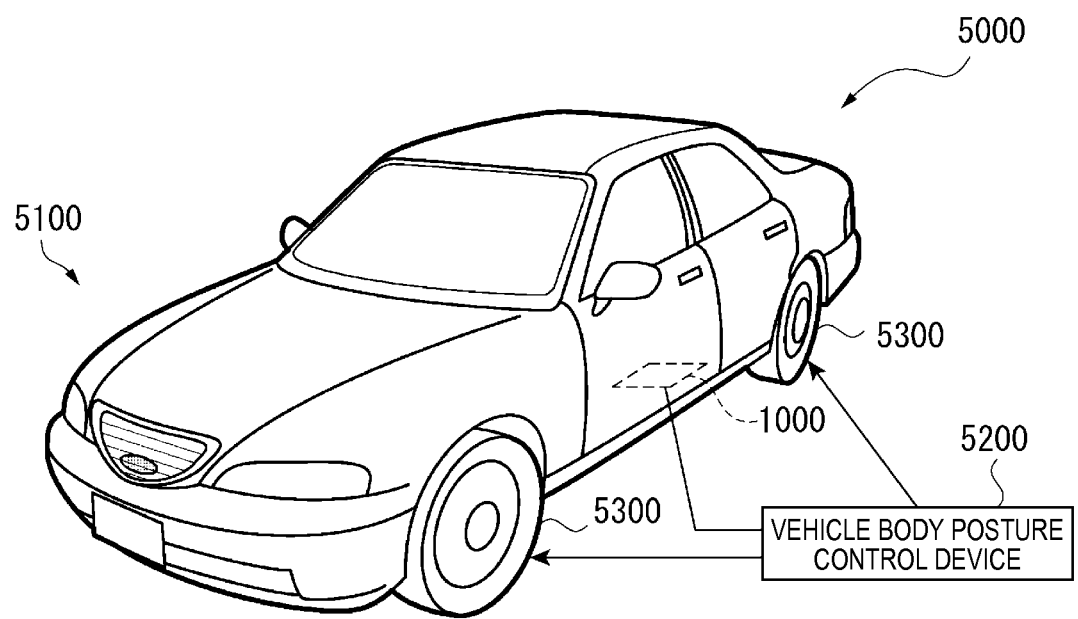
FIG. 11 is a diagram showing the exterior of a vehicle as a moving object according to a sixth embodiment.

A vehicle will be described as a specific example of a moving object according to a sixth embodiment which includes the sensor device 100 according to the first embodiment, the sensor device 200 according to the second embodiment, the electronic module 1000 according to the third embodiment, or the electronic module 2000 according to the fourth embodiment. FIG. 11 is a diagram showing the exterior of a vehicle 5000 according to the sixth embodiment. As shown in FIG. 11, the electronic module 1000 according to the third embodiment is embedded in the vehicle 5000. The electronic module 1000 detects the posture of a vehicle body 5100. A detected signal of the electronic module 1000 is supplied to a vehicle body posture control device 5200. The vehicle body posture control device 5200 can compute a posture state of the vehicle body 5100 on the basis of the supplied signal, can control, for example, the hardness and softness of a buffer device (so-called suspension) according to the posture of the vehicle body 5100, and can control a braking force of each vehicle wheel 5300. The posture control using the electronic module 1000 can be used in toys such as a bipedal walking robot, an aircraft, and a radio-controlled helicopter.

What is claimed is:

1. An electronic device comprising:
   a first base material;
   a second base material, having an accommodation space formed between the first base material and the second base material, which is bonded to the first base material through a bonding portion; and
   a first functional element and a second functional element which are accommodated in the accommodation space,
   wherein the bonding portion includes a first bonding region and a second bonding region, and
   wherein the first base material or the second base material is provided with a first wiring portion and a second wiring portion, the first wiring portion being electrically connected to the first functional element and having a first direction toward the outside of the accommodation space through the first bonding region and the second wiring portion being electrically connected to the second functional element and having a second direction toward the outside of the accommodation space through the second bonding region.

2. The electronic device according to claim 1,
   wherein the first base material or the second base material includes a partition wall portion, and the accommodation space is divided into a first accommodation space and a second accommodation space by the partition wall portion,
   wherein an extension direction of the partition wall portion is disposed along an extension direction of at least one of the first bonding region and the second bonding region,
   wherein the first accommodation space accommodates the first functional element, and the second accommodation space accommodates the second functional element, and
   wherein the first accommodation space and the second accommodation space have different internal environments.

3. The electronic device according to claim 2,
   wherein the first accommodation space accommodates an angular velocity sensor element as the first functional element, and the second accommodation space accommodates an acceleration sensor element as the second functional element, and
   wherein the internal environment of the first accommodation space has a decompressed atmosphere, and the internal environment of the second accommodation space has a barometric atmosphere.

4. The electronic device according to claim 3, wherein at least one of the angular velocity sensor element and the acceleration sensor element includes at least detection axes in two directions intersecting each other.

5. An electronic module comprising:
a first base material;
a second base material, having an accommodation space formed between the first base material and the second base material, which is bonded to the first base material through a bonding portion; and
a first functional element and a second functional element which are accommodated in the accommodation space,
wherein the bonding portion includes a first bonding region and a second bonding region, and
wherein the electronic module further comprises
an electronic device having a first wiring portion and a second wiring portion which are provided in the first base material or the second base material, the first wiring portion being electrically connected to the first functional element and having a first direction toward the outside of the accommodation space through the first bonding region and the second wiring portion being electrically connected to the second functional element and having a second direction toward the outside of the accommodation space through the second bonding region, and
a circuit element which is disposed so as to overlap at least a portion of the electronic device when seen in a plan view,
wherein the circuit element includes a first terminal portion electrically connected to the first wiring portion and a second terminal portion electrically connected to the second wiring portion, and
wherein the first terminal portion is disposed on the first bonding region side of the electronic device, and the second terminal portion is disposed on the second bonding region side of the electronic device.

6. The electronic module according to claim 5,
wherein the first base material or the second base material includes a partition wall portion, and the accommodation space is divided into a first accommodation space and a second accommodation space by the partition wall portion,
wherein an extension direction of the partition wall portion is disposed along an extension direction of at least one of the first bonding region and the second bonding region,
wherein the first accommodation space accommodates the first functional element, and the second accommodation space accommodates the second functional element, and
wherein the first accommodation space and the second accommodation space have different internal environments.

7. The electronic module according to claim 5,
wherein the first accommodation space accommodates an angular velocity sensor element as the first functional element,
wherein the second accommodation space accommodates an acceleration sensor element as the second functional element, and
wherein the internal environment of the first accommodation space has a decompressed atmosphere, and the internal environment of the second accommodation space has a barometric atmosphere.

8. The electronic module according to claim 7, wherein at least one of the angular velocity sensor element and the acceleration sensor element includes at least detection axes in two directions intersecting each other.

9. The electronic module according to claim 5,
wherein the first wiring portion and the first terminal portion are electrically connected to each other through a wire, and
wherein the second wiring portion and the second terminal portion are electrically connected to each other through a wire.

10. An electronic apparatus comprising the electronic device according to claim 1.

11. An electronic apparatus comprising the electronic device according to claim 2.

12. An electronic apparatus comprising the electronic device according to claim 3.

13. An electronic apparatus comprising the electronic module according to claim 5.

14. An electronic apparatus comprising the electronic module according to claim 6.

15. A moving object comprising the electronic device according to claim 1.

16. A moving object comprising the electronic device according to claim 2.

17. A moving object comprising the electronic device according to claim 3.

18. A moving object comprising the electronic module according to claim 5.

19. A moving object comprising the electronic module according to claim 6.

* * * * *